US012757365B2

(12) United States Patent
Araki

(10) Patent No.: US 12,757,365 B2

(45) Date of Patent: Oct. 6, 2026

(54) ELECTRICAL APPARATUS

(71) Applicant: DENSO CORPORATION, Kariya-city (JP)

(72) Inventor: Seido Araki, Kariya-city (JP)

(73) Assignee: DENSO CORPORATION, Kariya (JP)

(*) Notice: Subject to any disclaimer, the term of this patent is extended or adjusted under 35 U.S.C. 154(b) by 593 days.

(21) Appl. No.: 18/349,280

(22) Filed: Jul. 10, 2023

(65) Prior Publication Data

US 2023/0354568 A1 Nov. 2, 2023

Related U.S. Application Data

(63) Continuation of application No. PCT/JP2021/047482, filed on Dec. 22, 2021.

(30) Foreign Application Priority Data

Jan. 28, 2021 (JP) ................................ 2021-012367

(51) Int. Cl.

*H05K 9/00* (2006.01)
*H01H 1/58* (2006.01)

(52) U.S. Cl.

CPC ............ *H05K 9/0075* (2013.01); *H01H 1/58* (2013.01)

(58) Field of Classification Search

None

See application file for complete search history.

(56) References Cited

U.S. PATENT DOCUMENTS

| | | | | |
|---|---|---|---|---|
| 6,870,253 B1 | 3/2005 | Ushijima | | |
| 2007/0109715 A1* | 5/2007 | Azuma | H01G 4/38 | 361/299.3 |
| 2018/0109253 A1* | 4/2018 | Tanabe | H02M 7/003 | |
| 2020/0295672 A1* | 9/2020 | Okubo | H02M 7/53871 | |

FOREIGN PATENT DOCUMENTS

| | | |
|---|---|---|
| DE | 102016100617 A1 | 7/2017 |
| DE | 102016104283 A1 | 9/2017 |
| JP | 2018-73915 A | 5/2018 |
| WO | 2014/136335 A1 | 9/2014 |

* cited by examiner

*Primary Examiner* — Nishath Yasmeen

(74) *Attorney, Agent, or Firm* — Oliff PLC

(57) ABSTRACT

It comprises: a switch module including a switch, a first terminal and a second terminal connected to the switch, and a resin member covering the switch, the first terminal and the second terminal; a first power supply member electrically connected to a portion of the first terminal exposed from the resin member and one of two electrodes of a power supply; and a second power supply member electrically connected to a portion of the second terminal exposed from the resin member and the other one of the two electrodes of the power supply. A portion of the first power supply member connected to the first terminal and a part of the second power supply member overlap in a perpendicular direction perpendicular to an arrangement direction in which the first terminal and the second terminal are arranged.

12 Claims, 15 Drawing Sheets

ELECTRICAL APPARATUS

CROSS REFERENCE TO RELATED APPLICATIONS

The present application is a continuation application of International Patent Application No. PCT/JP2021/047482 filed on Dec. 22, 2021, which designated the U.S. and is based on and claims the benefit of priority from Japanese Patent Application No. 2021-012367 filed on Jan. 28, 2021, and all the contents of the application are incorporated by reference.

TECHNICAL FIELD

The present disclosure relates to an electrical apparatus.

BACKGROUND

A power control device, which is one of an electrical apparatus, includes a plurality of conductive members for current to be controlled. In this configuration, conductive members are formed and arranged to reduce an impedance including an inductance. The conductive members are also formed and arranged to reduce magnetic flux among them. On the other hand, the conductive members are required to be connected to electrical components such as a capacitor, and a switching module. In the above aspects, or in other aspects not mentioned, there is a need for further improvements in an electrical apparatus.

SUMMARY

An electrical apparatus according to one aspect of the present disclosure comprises:

- a switch module including a switch, a first terminal and a second terminal connected to the switch, and a resin member covering the switch, the first terminal and the second terminal,
- a first power supply member electrically connected to a portion of the first terminal exposed from the resin member and one of two electrodes of a power supply; and a second power supply member electrically connected to a portion of the second terminal exposed from the resin member and the other one of the two electrodes of the power supply, wherein

- a portion of the first power supply member connected to the first terminal and a part of the second power supply member overlap in a perpendicular direction perpendicular to an arrangement direction in which the first terminal and the second terminal are arranged.

According to this, a magnetic field is easily canceled between the portion of the first power supply member connected to the first terminal and the part of the second conductive member. For this reason, an inductance of the first power supply member and the second power supply member is likely to be reduced.

The reference numerals in parentheses in the appended claims indicate only a correspondence relationship with the configuration described in the embodiment to be described later, and do not limit the technical scope in any way.

DETAILED DESCRIPTION

Figure 1:
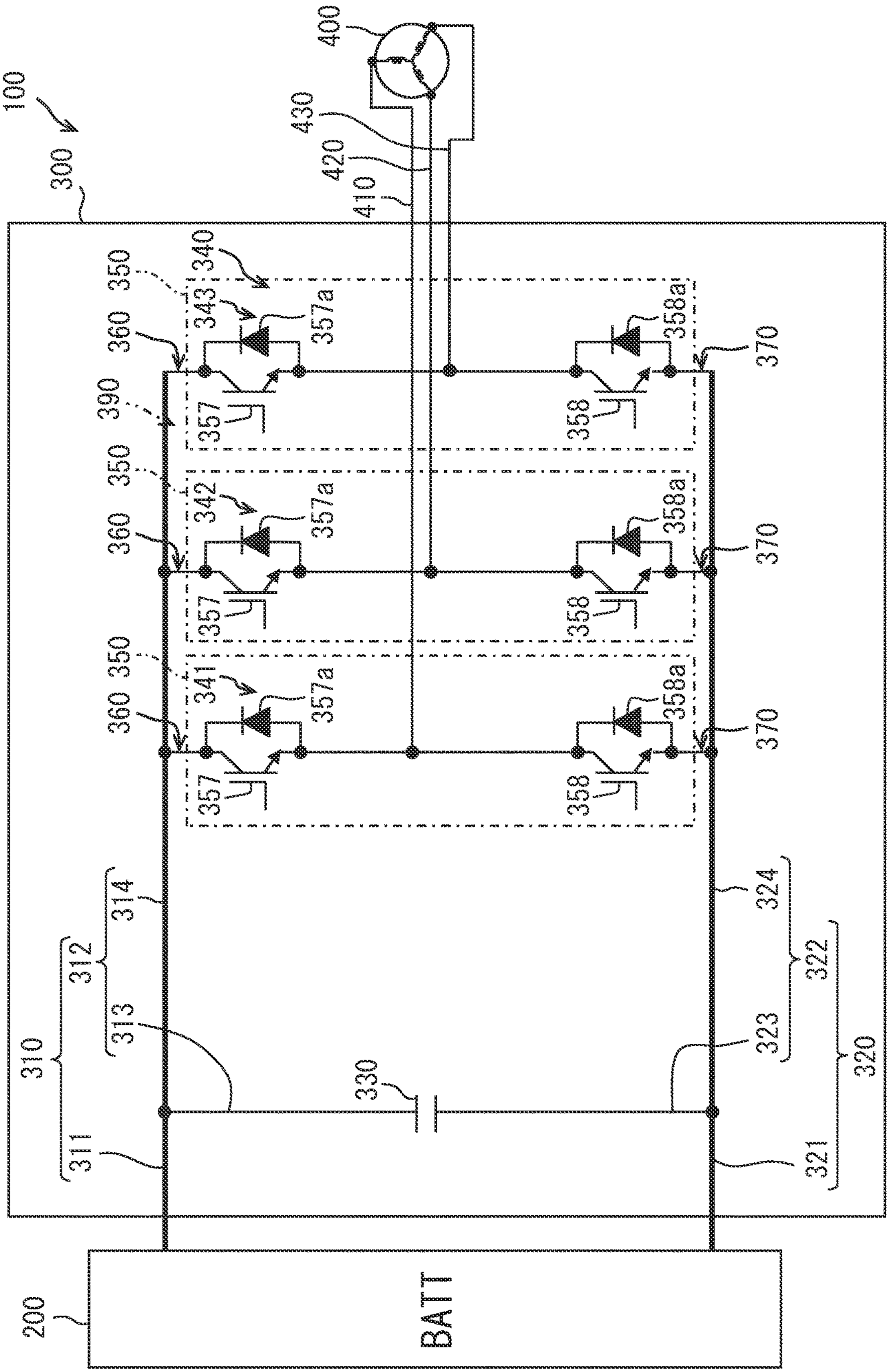
FIG. 1 is a circuit diagram explaining an in-vehicle system.

JP2018-73915A describes a power control device which has a semiconductor module including a switching element, and a positive terminal and a negative terminal connected to the switching element. The positive terminal and the negative terminal each extend from one side of the semiconductor module.

The power control device includes, in addition to the semiconductor module, a positive busbar connected to the positive terminal of the semiconductor module and a negative busbar connected to the negative terminal of the semiconductor module.

In this configuration, a magnetic field is less likely to cancel out between a portion of the positive busbar connected to the positive terminal and the negative busbar. An inductance of the positive busbar (a first power supply member) and the negative busbar (a second power supply member) is less likely to be decreased.

Accordingly, it is an object of the present disclosure to provide an electrical apparatus in which an inductance of the first power supply member and the second power supply member is reduced.

Hereinafter, embodiments for carrying out the present disclosure are described with reference to the drawings. In each embodiment, parts corresponding to the elements described in the preceding embodiments are denoted by the same reference numerals, and redundant explanation may be omitted. When only a part of a configuration is described in an embodiment, the other preceding embodiments can be applied to the other parts of the configuration.

In addition, not only the combination between portions explicitly described that the combination is possible in each embodiment, but also partial combinations between the embodiments, between the embodiment and the modification, and between the modifications can be made if there is no problem in the combination in particular even when not explicitly described.

First Embodiment

First, an in-vehicle system 100 provided with an electrical apparatus 300 is described with reference to FIG. 1. The in-vehicle system 100 is a system for an electric vehicle. The in-vehicle system 100 has a battery 200, an electrical apparatus 300, a motor 400, and a board (not shown). The battery 200 corresponds to a power source.

A plurality of ECUs are mounted on the board. The ECUs transmit signals to and receive signals from each other via a bus wiring. The ECUs control the electric vehicle in a cooperative manner. The regeneration and powering of the motor 400 according to a state of charge (SOC) of the battery 200 are controlled by the ECUs. The SOC is an abbreviation of state of charge. ECU is an abbreviation of electronic control unit.

The battery 200 includes a plurality of secondary batteries. The secondary batteries form a battery stack connected in series. The SOC of the battery stack corresponds to the SOC of the battery 200. As the secondary batteries, a lithium ion secondary battery, a nickel hydrogen secondary battery, an organic radical battery, or the like may be employed.

<Electrical Apparatus>

The electrical apparatus 300 performs power conversion between the battery 200 and the motor 400. The electrical apparatus 300 converts a DC power of the battery 200 into an AC power. The electrical apparatus 300 converts the AC power generated by a power generation, i.e., a regeneration of the motor 400 into the DC power.

The motor 400 is coupled with an output shaft of the electric vehicle which is not shown. The rotational energy of the motor 400 is transmitted to traveling wheels of the electric vehicle via an output shaft. On the contrary, the rotational energy of the traveling wheels is transmitted to the motor 400 via the output shaft.

The motor 400 is powered by the AC power supplied from the electrical apparatus 300. Accordingly, propulsive force is applied to the traveling wheels. Further, the motor 400 performs regeneration by the rotational energy transmitted from the traveling wheels. The AC power generated by this regeneration is converted into the DC power by the electrical apparatus 300. This DC power is supplied to the battery 200. The DC power is also supplied to various electric loads mounted on the electric vehicle.

The electrical apparatus 300 includes semiconductor elements such as switches, which is described later. In this embodiment, n-channel IGBTs are used as the switches. However, MOSFETs may be used instead of the IGBTs for these switches. If the MOSFETs are used as the switches, the diode may be omitted.

These switches may be made from semiconductors such as Si and wide-gap semiconductors such as SiC. A material of semiconductor elements is not particularly limited.

<Electrical Connection of Electrical Apparatus>

The electrical apparatus 300 has a positive terminal 360, a negative terminal 370 and an output terminal 440 connected to a capacitor 330 and each of a plurality of legs 340.

In FIG. 1, a U-phase leg 341, a V-phase leg 342, and a W-phase leg 343 are extracted and illustrated as representatives of the plurality of legs 340. The first power supply busbar 310 corresponds to a first power supply member. The second power supply busbar 320 corresponds to a second power supply member. The positive terminal 360 corresponds to a first terminal. The negative terminal 370 corresponds to a second terminal.

The first power supply busbar 310 is connected to a positive electrode of the battery 200. The second power supply busbar 320 is connected to a negative electrode of the battery 200. The capacitor 330, the U-phase leg 341, the V-phase leg 341 and the W-phase leg 343 are connected between the first power supply busbar 310 and the second power supply busbar 320, respectively.

The capacitor 330 has two electrodes. One electrode of these two electrodes is connected to the first power supply busbar 310. The other one electrode of these two electrodes is connected to the second power supply busbar 320.

Each of the U-phase leg 341, the V-phase leg 342 and the W-phase leg 343 has two switches connected in series. Each of the U-phase leg 341, the V-phase leg 342 and the W-phase leg 343 has a high-side switch 357 and a low-side switch 358 as switches. Also, each of the U-phase leg 341, the V-phase leg 342 and the W-phase leg 343 has a high-side diode **357*a* and a low-side diode 358*a* as diodes. Each of the high-side switch 357 and the low-side switch 358** corresponds to a switch.

As shown in FIG. 1, a collector electrode of the high-side switch 357 is connected to the positive terminal 360. The positive terminal 360 is connected to the first power supply busbar 310. An emitter electrode of the high-side switch 357 and a collector electrode of the low-side switch 358 are connected. An emitter electrode of the low-side switch 358 is connected to the negative terminal 370. The negative terminal 370 is connected to the second power supply busbar 320. As a result, the high-side switch 357 and the low-side switch 358 are connected in series in an order from the first power supply busbar 310 to the second power supply busbar 320.

Further, a cathode electrode of the high-side diode **357*a* is connected to the collector electrode of the high-side switch 357. An anode electrode of the high-side diode 357*a* is connected to the emitter electrode of the high-side switch 357. In this configuration, the high-side diode 357*a* is connected to the high-side switch 357** in a reverse-parallel manner.

Similarly, a cathode electrode of the low-side diode **358*a* is connected to the collector electrode of the low-side switch 358. An anode electrode of the low-side diode 358*a* is connected to the emitter electrode of the low-side switch 358. In this configuration, the low-side diode 358*a* is connected to the low-side switch 358** in a reverse-parallel manner.

Furthermore, a U-phase busbar 410 is connected to a midpoint between the high-side switch 357 and the low-side switch 358 provided in the U-phase leg 341. The U-phase busbar 410 is connected to the output terminal 440 and a U-phase stator coil of the motor 400.

The V-phase busbar 420 is connected to a midpoint between the high-side switch 357 and the low-side switch 358 of the V-phase leg 342. The V-phase busbar 420 is connected to the output terminal 440 and a V-phase stator coil of the motor 400.

The W-phase busbar 430 is connected to a midpoint between the high-side switch 357 and the low-side switch 358 of the W-phase leg 343. The W-phase busbar 430 is connected to the output terminal 440 and a W-phase stator coil of the motor 400.

If the motor 400 is powered, all of the high-side switches 357 and the low-side switches 358 provided in the U-phase leg 341, the V-phase leg 342 and the W-phase leg 343 are PWM-controlled by the control signal from the ECU. Thereby, a three-phase AC current is generated in the electrical apparatus 300. If the motor 400 generates, i.e., regenerates, electricity, the ECU stops outputting of a control signal, for example. As a result, the AC power generated by the power generation of the motor 400 passes through the U-phase leg 341, the V-phase leg 342 and the W-phase leg 343. As a result, the AC power and the DC power are converted in both directions.

Figure 2:
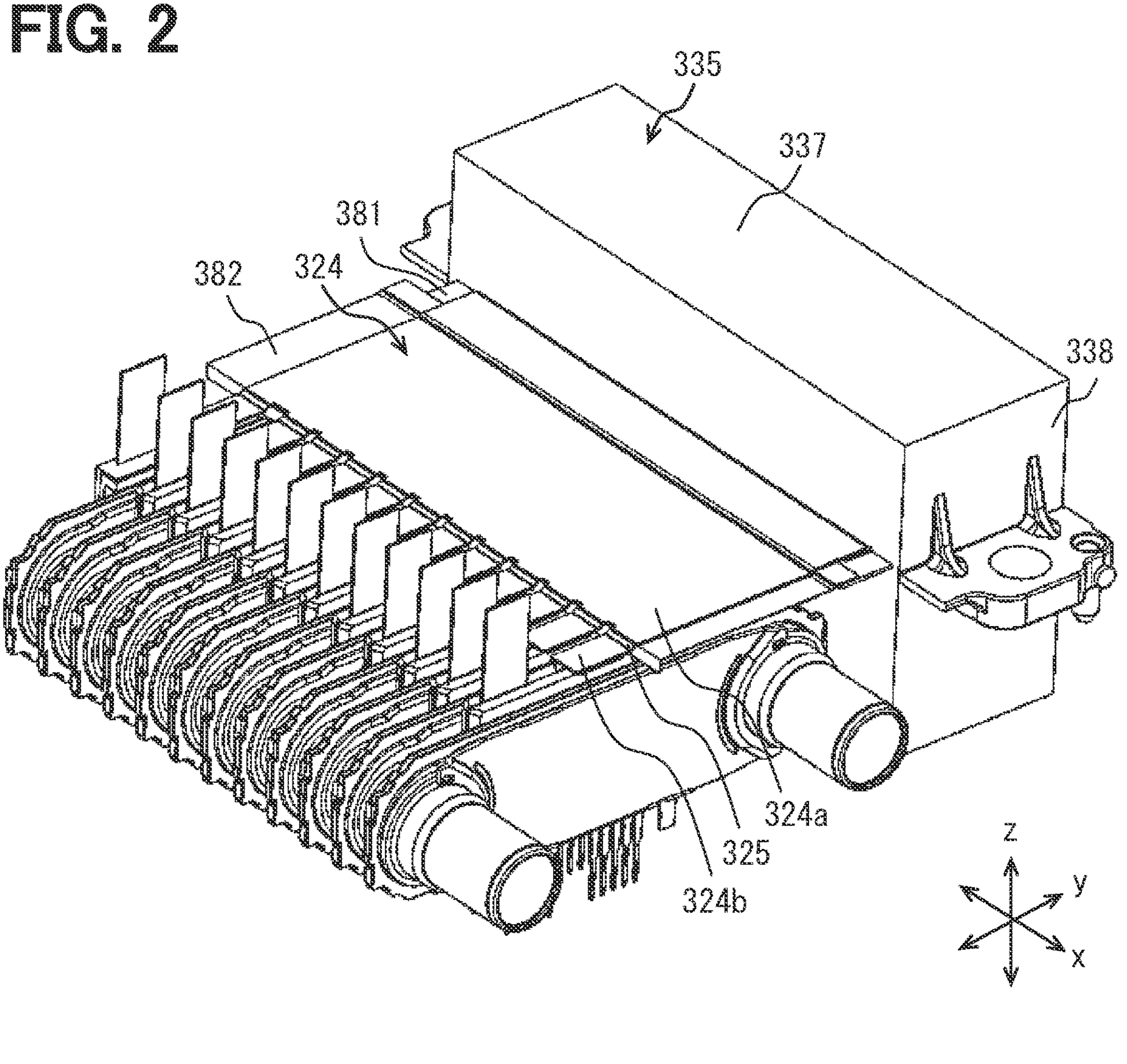
FIG. 2 is a perspective view explaining an electrical apparatus.

It should be noted that electrical apparatus 300 is provided with nine sets of the leg 340 in addition to the three sets of the leg 340 including the U-phase leg 341, the V-phase leg 342 and the W-phase leg 343 as shown in FIG. 2 and later. The positive terminal 360 is connected to the collector electrode of each one of the high-side switch 357 of the nine sets of the leg 340. The negative terminal 370 is connected to the emitter electrode of each one of the low-side switch 358 of the nine sets of the leg 340. The positive terminal 360 and the negative terminal 370 connected to these nine sets of the leg 340 are connected to the first power supply busbar 310 and the second power supply busbar 320, respectively.

<Mechanical Configuration of Electrical Apparatus>

Next, the mechanical configuration of the electrical apparatus 300 is described. Three directions perpendicular to one another are referred to as an x-direction, a y-direction, and a z-direction. The y-direction corresponds to an arrangement direction. The z-direction corresponds to a perpendicular direction. In the drawings, the word "direction" is omitted. In the drawing, the battery 200 is abbreviated as "BATT".

The electrical apparatus 300 includes, as the components described so far, the first power supply busbar 310, the second power supply busbar 320, the capacitor 330, twelve sets of the leg 340, and the positive terminals 360, the negative terminals 370 and the output terminals 440 connected to the twelve sets of the leg 340.

The electrical apparatus 300 also has a capacitor case 335, twelve pieces of the covering resin 350, a first insulating plate 381 and a second insulating plate 382 in addition to the components described above. Note that the covering resin 350 corresponds to a resin member.

Describing a mechanical configuration of the electrical apparatus 300, first, descriptions for the covering resin 350 and the switch module 390 are provided hereinafter.

Figure 4:
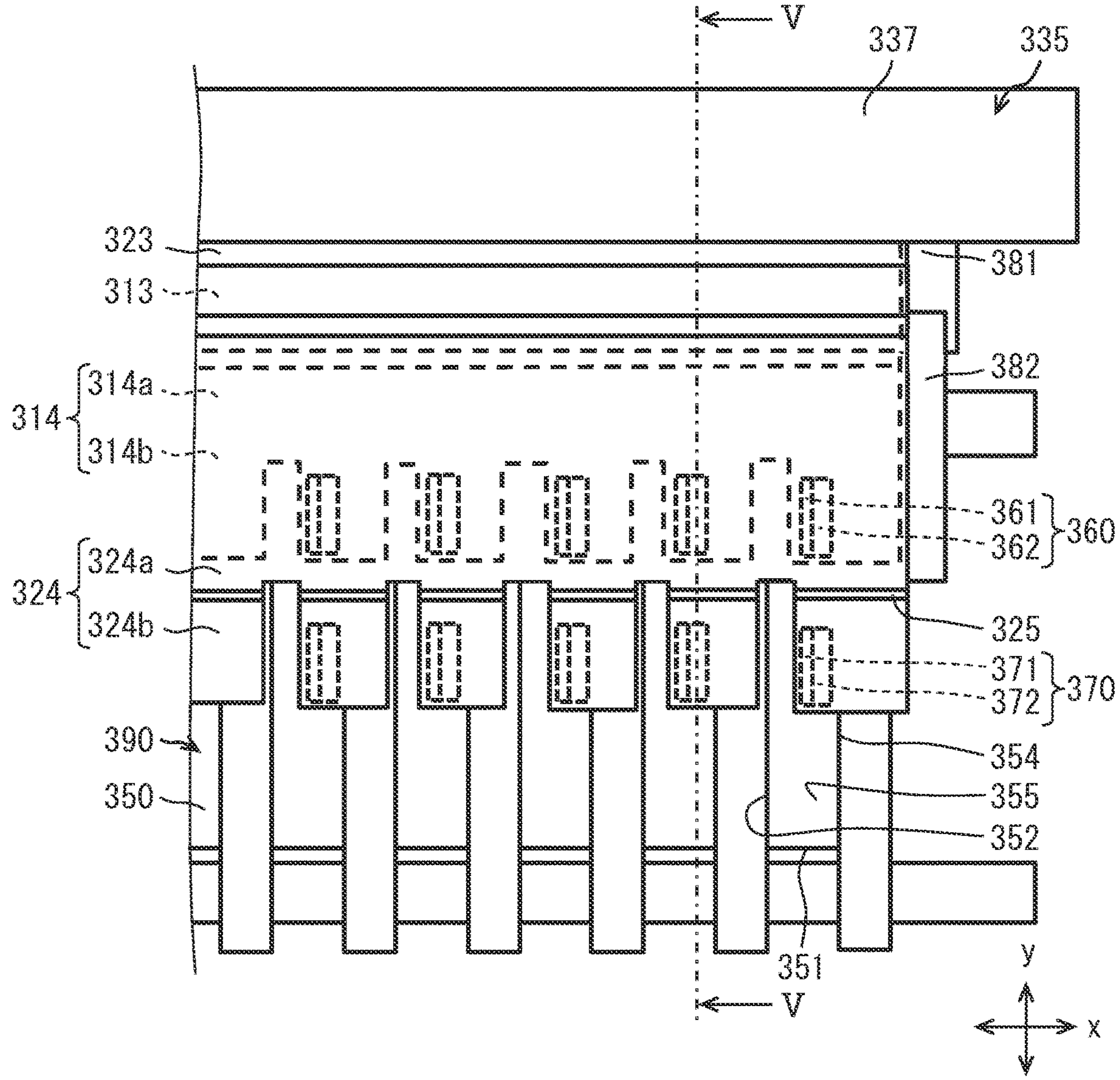
FIG. 4 is a top view explaining the electrical apparatus.
Figure 5:
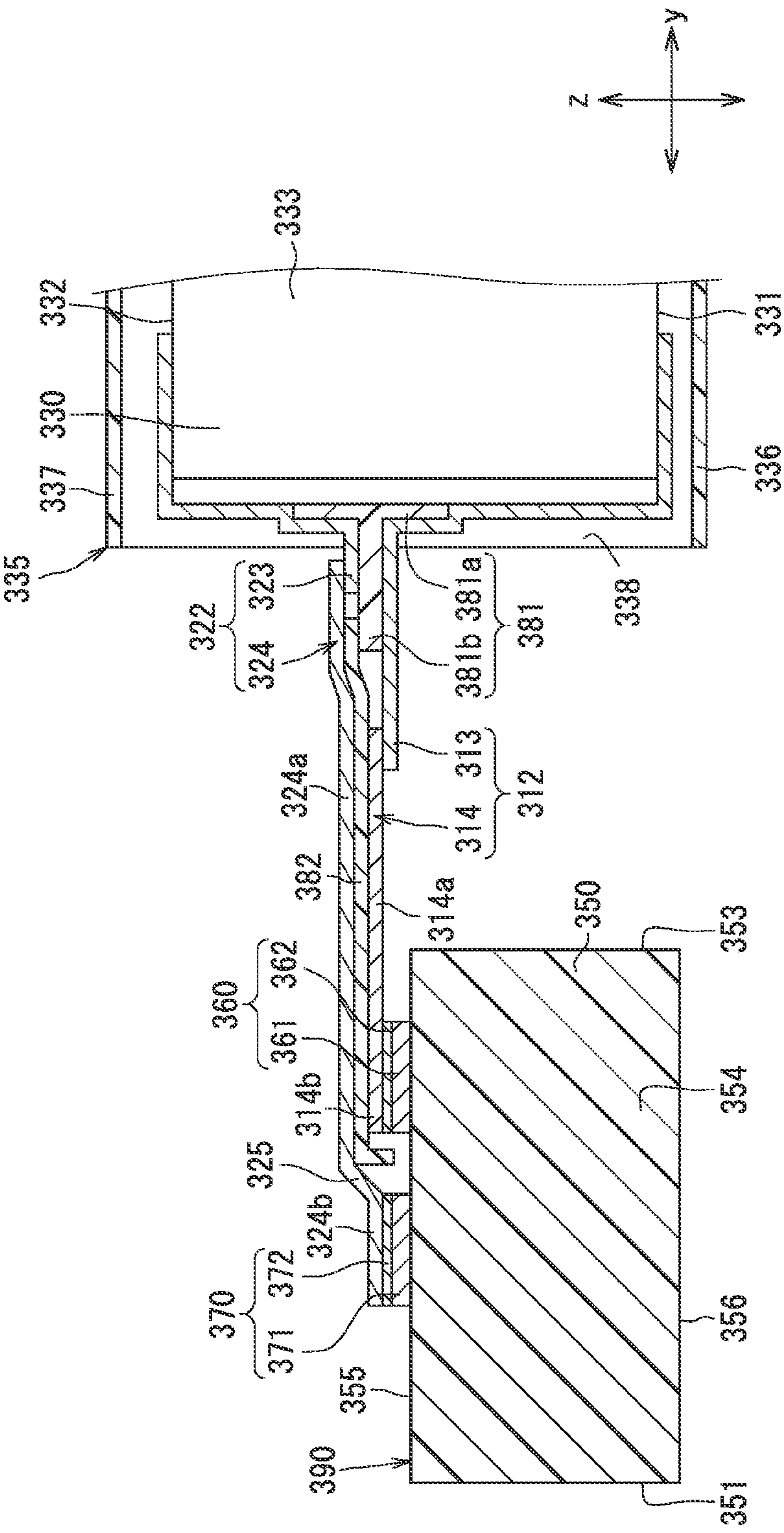
FIG. 5 is a cross-sectional view taken along a line V-V in FIG. 4.

The covering resin 350 has a substantially rectangular shape. As shown in FIG. 4 and FIG. 5, the covering resin 350 includes a first outer surface 351 and a third outer surface 353 arranged in a spaced apart manner in the y-direction, a second outer surface 352 and a fourth outer surface 354 arranged in a spaced apart manner in the x-direction, and a fifth outer surface 355 and a sixth outer surface 356 arranged in a spaced apart manner in the z-direction.

The first outer surface 351, the second outer surface 352, the third outer surface 353, and the fourth outer surface 354 are connected in a ring shape. The fifth outer surface 355 is connected to one end side in the z-direction of the first outer surface 351 to the fourth outer surface 354. The sixth outer surface 356 is connected to the other end side in the z-direction of the first outer surface 351 to the fourth outer surface 354.

One leg 340 and a part of each of the positive terminal 360, the negative terminal 370 and the output terminal 440 connected to the one leg 340 are covered with a piece of the covering resin 350.

Figure 3:
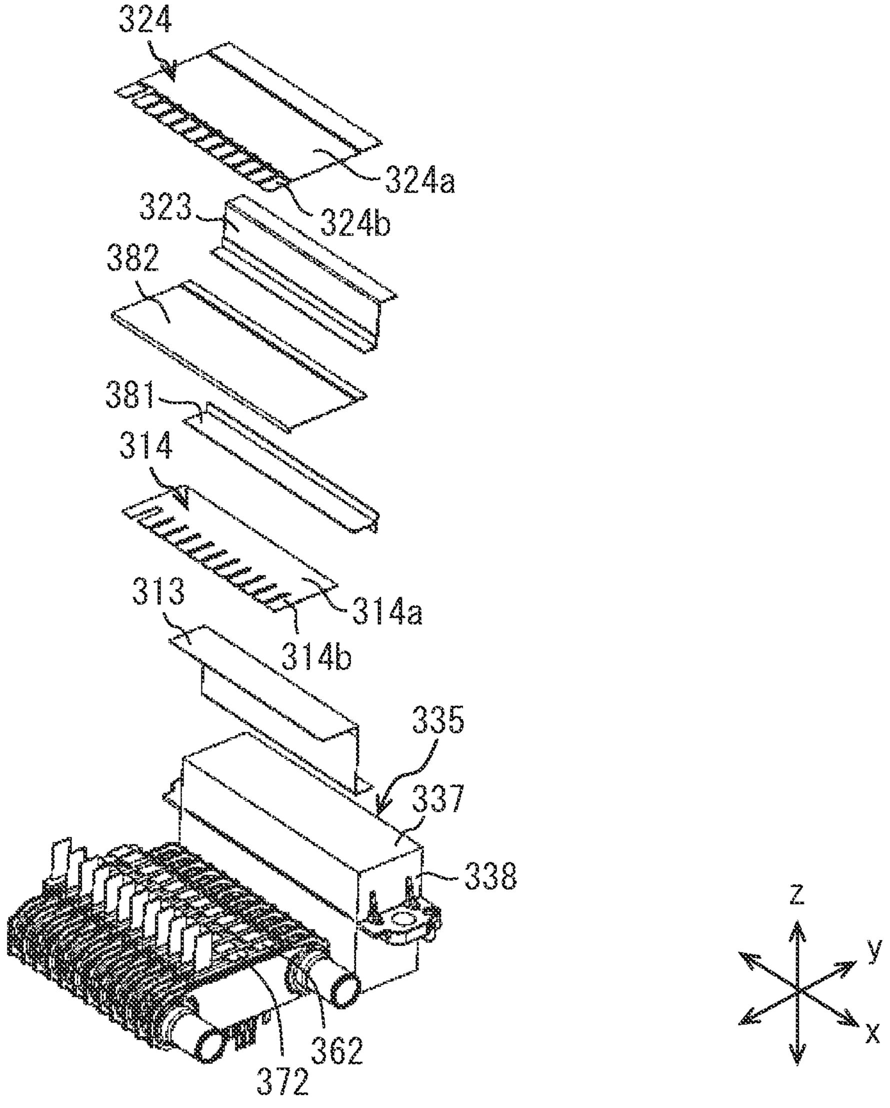
FIG. 3 is a perspective view explaining the electrical apparatus.

Further, remaining parts of each of the positive terminal 360, the negative terminal 370 and the output terminal 440 are exposed from the fifth outer surface 355. One leg 340, the positive terminal 360, the negative terminal 370 and the output terminal 440 connected thereto are covered with a piece of the covering resin 350 to form a piece of the switch module 390. As shown in FIGS. 2-4, twelve pieces the switch module 390 are arranged in a stacked manner in the x-direction. Note that the output terminal 440 is omitted from FIG. 4 and later.

<Positive Terminal>

The positive terminal 360 has a positive electrode base member 361 connected to the collector electrode of the high-side switch 357 and a positive electrode distal end member 362 connected to the positive electrode base member 361. The positive electrode base member 361 corresponds to a terminal base member. The positive electrode distal end member 362 corresponds to the terminal distal end member.

As shown in FIG. 4 and FIG. 5, the positive electrode base member 361 extends in the z-direction. A part of the positive electrode base member 361 is exposed from the fifth outer surface 355. A part of the positive electrode base member 361 exposed from the fifth outer surface 355 has a flat shape with a thin thickness in the x-direction.

The positive electrode distal end member 362 is connected to the end of the positive electrode base member 361 in the z-direction. The positive electrode distal end member 362 extends in the x-direction away from the end of the positive electrode base member 361 in the z-direction.

Although not shown, the positive electrode terminal 360 may have only the positive electrode base member 361 without the positive electrode distal end member 362. In that case, the first extension distal end member **314*b* may be connected to the positive electrode base member 361**.

In addition, although not shown, a portion of the positive electrode base member 361 exposed from the fifth outer surface 355 may have a flat shape with a thin thickness in the y-direction. In that case, the positive electrode distal end member 362 may extend in the y-direction away from an end of the positive electrode base member 361 in the z-direction.

<Negative Terminal>

The negative terminal 370 has a negative electrode base member 371 connected to the emitter electrode of the low-side switch 358 and a negative electrode distal end member 372 connected to the negative electrode base member 371.

As shown in FIG. 4 and FIG. 5, the negative electrode base member 371 extends in the z-direction. A part of the negative electrode base member 371 is exposed from the fifth outer surface 355. A part of the negative electrode base member 371 exposed from the fifth outer surface 355 has a flat shape with a thin thickness in the x-direction.

The negative electrode distal end member 372 is connected to the end of the negative electrode base member 371 in the z-direction. The negative electrode distal end member 372 extends in the x-direction away from an end of the negative electrode base member 371 in the z-direction.

Although not shown, the negative electrode terminal 370 may have only the negative electrode base member 371 without the negative electrode distal end member 372. In that case, the second extension distal end member **324*b* may be connected to the negative electrode base member 371**.

In addition, although not shown, a part of the negative electrode base member 371 exposed from the fifth outer surface 355 may have a flat shape with a thin thickness in the y-direction. In that case, the negative electrode distal end member 372 may extend in the y-direction away from an end of the negative electrode base member 371 in the z-direction.

<First Power Supply Busbar>

As shown in FIG. 1, the first power supply busbar 310 has a first supply member 311 and a first conductive member 312. The first supply member 311 connects the positive electrode of the battery 200 and one of the electrodes of the capacitor 330. The first conductive member 312 connects one of the electrodes of the capacitor 330 and the positive electrode distal end member 362 of each of twelve pieces of the positive terminal 360.

The first conductive member 312 has separated members of a first conductive base member 313 and a first conductive extension portion 314. The first conductive base member 313 corresponds to a first power supply base member. The first conductive extension member 314 corresponds to the first power supply distal end member.

One end of the first conductive base member 313 is connected to one of the electrodes of the capacitor 330. The other end of the first conductive base member 313 extends in the y-direction toward the switch module 390.

One end of the first conductive extension member 314 is electrically and mechanically connected to the other end of the first conductive base member 313. The other end of the first conductive extension member 314 extends in the y-direction toward each of the positive electrode distal end member 362 of twelve pieces of the positive terminal 360. The other end of the first conductive extension member 314 is electrically and mechanically connected to each of the positive electrode distal end members 362 of twelve pieces of the positive terminal 360.

Note that electrically and mechanically connecting the separate parts corresponds to joining the separate parts.

Specifical about the first conductive extension member 314, the first conductive extension member 314 has a first extension base member **314*a* and a plurality of first extension distal end members 314*b***.

The first extension base member **314*a* is connected to the other end of the first conductive base member 313 and extends toward the switch module 390 in the y-direction. Each of the plurality of first extension distal end members 314*b* is integrally connected to a side end of the switch module 390 of the first extension base member 314*a***.

Each of the plurality of first extension distal end members **314*b* is separated by a predetermined distance in the x-direction. Each of the plurality of first extension distal end members 314*b* extends in the y-direction toward each of the positive electrode distal end members 362 of twelve pieces of the positive terminal 360. Each of the plurality of first extension distal end members 314*b* is electrically and mechanically connected to each of the positive electrode distal end members 362 of twelve pieces of the positive terminal 360**.

<Second Power Supply Busbar>

As shown in FIG. 1, the second power supply busbar 320 has a second supply member 321 and a second conductive member 322. The second supply member 321 connects the positive electrode of the battery 200 and the other one of the electrodes of the capacitor 330. The second conductive member 322 connects one of the electrodes of the capacitor 330 and the negative electrode distal end member 372 of each of twelve pieces of the negative terminal 370.

The second conductive member 322 has separated members of a second conductive base member 323 and a second conductive extension portion 324. The second conductive base member 323 corresponds to a second power supply base member. The second conductive extension member 324 corresponds to the second power supply distal end member.

One end of the second conductive base member 323 is connected to the other one of the electrodes of the capacitor 330. The other end of the second conductive base member 323 extends in the y-direction toward the switch module 390.

One end of the second conductive extension member 324 is electrically and mechanically connected to the other end of the second conductive base member 323. The other end of the second conductive extension member 324 extends in the y-direction toward each of the negative electrode distal end member 372 of twelve pieces of the negative terminal 370. The other end of the second conductive extension member 324 is electrically and mechanically connected to each of the negative electrode distal end members 372 of twelve pieces of the negative terminal 370.

Specifical about the second conductive extension member 324, the second conductive extension member 324 has a second extension base member **324*a* and a plurality of second extension distal end members 324*b***.

The second extension base member **324*a* is connected to the other end of the second conductive base member 323 and extends toward the switch module 390 in the y-direction. Each of the plurality of second extension distal end members 324*b* is integrally connected to a side end of the switch module 390 of the second extension base member 324*a***.

Each of the plurality of second extension distal end members **324*b* is separated by a predetermined distance in the x-direction. Each of the plurality of second extension distal end members 324*b* extends in the y-direction toward each of the negative electrode distal end members 372 of twelve pieces of the negative terminal 370. Each of the plurality of second extension distal end members 324*b* is electrically and mechanically connected to each of the negative electrode distal end members 372 of twelve pieces of the negative terminal 370**.

<First Insulating Plate>

As shown in FIGS. 3-5, the first insulating plate 381 is provided between the first conductive base member 313 and the second conductive base member 323 in the z-direction. The first insulating plate 381 has a function of maintaining insulation between the first conductive base member 313 and the second conductive base member 323. For example, the first insulating plate 381 is made of a resin member. Note that the first insulating plate 381 is not limited to a resin member.

<Second Insulating Plate>

As shown in FIGS. 3-5, the second insulating plate 382 is provided between the first conductive extension member 314 and the second conductive extension member 324 in the z-direction. This has a function of maintaining an insulation between the first conductive extension portion 314 and the second conductive extension portion 324. For example, the second insulating plate 382 is made of a resin member. Note that the second insulating plate 382 is not limited to a resin member.

<Capacitor Case>

The capacitor case 335 is a case for accommodating the capacitor 330. As shown in FIG. 5, the capacitor case 335 has a lower case portion 336 and an upper case portion 337 arranged in the z-direction, and a case connecting portion 338 connecting them.

The capacitor 330, a part of the first conductive base member 313, a part of the second conductive base member 323 and a part of the first insulating plate 381 are accommodated in a case space defined by the lower case portion 336, the upper case portion 337 and the case connecting portion 338.

Further, an epoxy is filled in the case space. As a result, the capacitor 330, a part of the first conductive base member 313, a part of the second conductive base member 323 and a part of the first insulating plate 381 are fixed to the capacitor case 335.

<Specific Mechanical Connection Between Switch Module and Capacitor>

As shown in FIG. 3, the first conductive base member 313, the first conductive extension member 314, the first insulating plate 381, the second insulating plate 382, the second conductive base member 323 and the second conductive extension member 324 are stacked in the z-direction.

As shown in FIG. 4 and FIG. 5, each of twelve pieces of the switch module 390 and the capacitors 330 are arranged in a spaced apart manner in the y-direction. The third outer surface 353 of the covering resin 350 is located on a side to the capacitor 330. The first outer surface 351 of the covering resin 350 is located on a side away from the capacitor 330 in the y-direction.

The mechanical connection form of the switch module 390 and the capacitor 330 is described below with reference to FIGS. 1-5.

First, a configuration of the switch module 390 is described. As shown in FIG. 5, a portion of the positive terminal 360 is exposed from a portion of the fifth outer surface 355 on a side to the capacitor 330. A portion of the negative terminal 370 is exposed from a portion of the fifth outer surface 355 on the side away from the capacitor 330 in the y-direction.

In other words, a portion of the positive electrode base member 361 exposed from the fifth outer surface 355 and the positive electrode distal end member 362 are exposed from a portion of the fifth outer surface 355 on a side to the third outer surface 353. A portion of the negative electrode distal end member 372 exposed from the fifth outer surface 355 and the negative electrode distal end member 372 are exposed from a portion of the fifth outer surface 355 on a side to the first outer surface 351.

A portion of the positive electrode base member 361 exposed from the fifth outer surface 355 and the positive electrode distal end member 362 and a portion of the negative electrode distal end member 372 exposed from the fifth outer surface 355 and the negative electrode distal end member 372 are arranged in a spaced apart manner in the y-direction. The portion of the positive electrode base member 361 exposed from the fifth outer surface 355 and the positive electrode distal end member 362 are located closer to the capacitor 330 in the y-direction than the portion of the negative electrode distal end member 372 exposed from the fifth outer surface 355 and the negative electrode distal end member 372.

Next, a configuration of the capacitor 330 is described. As shown in FIG. 5, the capacitor 330 has a capacitor lower surface 331 and a capacitor upper surface 332 spaced apart in the z-direction, and a capacitor connecting surface 333 connecting them. The capacitor lower surface 331 and the capacitor upper surface 332 are connected by the capacitor connecting surface 333.

An electrode connected to the positive electrode of the battery 200 is provided on the capacitor lower surface 331. An electrode connected to the negative electrode of the battery 200 is provided on the capacitor upper surface 332.

Next, a form of connection between the first conductive base member 313 and the second conductive base member 323 to the capacitor 330 is described. One end of the first conductive base member 313 is connected to the capacitor lower surface 331. The first conductive base member 313 extends along the capacitor lower surface 331 in the y-direction toward the switch module 390 and then extends along the capacitor connecting surface 333 on a side to the switch module 390 toward the capacitor upper surface 332 in the z-direction. Thereafter, the first conductive base member 313 extends from an end on a side to the capacitor upper surface 332 toward the switch module 390 in the y-direction.

Similarly, one end of the second conductive base 323 is connected to the capacitor upper surface 332. The second conductive base member 323 extends along the capacitor upper surface 332 in the y-direction toward the switch module 390 and then extends along the capacitor connecting surface 333 on a side to the switch module toward the capacitor lower surface 331 in the z-direction. After that, the second conductive base member 323 extends from the end on a side to the capacitor bottom surface 331 toward the switch module 390 in the y-direction.

The first insulating plate 381 is provided between a portion of the first conductive base member 313 extending toward the switch module 390 in the y-direction and a portion of the second conductive member 322 extending toward the switch module 390 in the y-direction.

In other words, the portion of the first conductive base member 313 extending toward the switch module 390 in the y-direction, the portion of the second conductive base member 323 extending toward the switch module 390 in the y-direction, and the first insulating plate 381 are overlapped in the z-direction.

Next, the first insulating plate 381 is described. As shown in FIG. 5, the first insulating plate 381 is a T-shape. The first insulating plate 381 includes a first insulating base member 381*a* extending in the z-direction along the capacitor connecting surface 333 on a side to the switch module 390, and a first insulating extension member 381*b* extending in the y-direction toward the switch module 390 from a center of the first insulating base member 381*a* in the z-direction.

Next, a form of connection of the first conductive extension member 314 to the first conductive base member 313 and the positive electrode distal end member 362 is described. The first conductive extension member 314 extends in the y-direction from a side to the capacitor 330 toward a side to the switch module 390 side. One end of the first conductive extension member 314 is electrically and mechanically connected to a portion of the first conductive base member 313 on a side to the switch module 390 and on a side to the capacitor upper surface 332 by welding or the like.

The other end of the first conductive extension member 314 on a side to the switch module 390 overlaps a portion of the positive electrode distal end member 362 on a side away from the fifth outer surface 355 in the z-direction. In other words, the first extension distal end member 314*b* of the first conductive extension member 314 overlaps a portion of the positive electrode distal end member 362 on a side away from the fifth outer surface 355 in the z-direction. The first extension distal end member 314*b* of the first conductive extension member 314 is electrically and mechanically connected to a portion of the positive electrode distal end member 362 away from the fifth outer surface 355 by welding or the like.

Next, a form of connection of the second conductive extension member 324 to the second conductive base member 323 and the negative electrode distal end member 372 is described. The second conductive extension member 324 extends in the y-direction from a side to the capacitor 330 toward a side to the switch module 390. One end of the second conductive extension member 324 is electrically and mechanically connected to a portion of the second conductive base member 323 on a side to the switch module 390 and on a side to the capacitor upper surface 332 by welding or the like.

The other end of the second conductive extension member 324 on a side to the switch module 390 overlaps a portion of the negative electrode distal end member 372 on a side away from the fifth outer surface 355 in the z-direction. In other words, the second extension distal end member 324*b* of the first conductive extension member 324 overlaps a portion of the negative electrode distal end member 372 on a side away from the fifth outer surface 355 in the z-direction. The second extension distal end member 324*b* of the second conductive extension member 324 is electrically and mechanically connected to a portion of the negative electrode distal end member 372 away from the fifth outer surface 355 by welding or the like.

In addition, a portion of the second conductive extension member 324 between a connection portion with the second conductive base member 323 and a connection portion with the negative electrode distal end member 372 overlaps a portion of the first conductive extension member 314 connected to the positive electrode distal end member 362 in the z-direction.

In other words, the portion of the second conductive extension member 324 between the connection portion with the second conductive base member 323 and the connection portion with the negative electrode distal end member 372 overlaps the first extension distal end member 314*b* in the z-direction.

The second conductive extension member 324 is formed with a bent portion 325 which extends in each of the y-direction and the z-direction and is located between a connection portion to the negative electrode distal end member 372 and a portion overlapping the first extension distal end member 314*b* in the z-direction. Note that the bent portion 325 may be a part of a second curved portion 327, which is described later.

Next, a second insulating plate 382 is described. The second conductive extension member 382 extends in the y-direction from a side to the capacitor 330 toward a side to the switch module 390. As shown in FIG. 5, a second insulating plate 382 is provided between the second conductive extension member 324 and the first insulating extension member 381*b* on a side to the capacitor 330. The second insulating plate 382 is provided between the second conductive extension member 324 and the first conductive extension member 314 on a side to the switch module 390.

One end of the second insulating plate 382 on a side to the capacitor 330 is provided at a portion of the first insulating extension member 381*b* on a side to the capacitor upper surface 332. The other end of the second insulating plate 382 on a side to the switch module 390 is provided at a portion of the first extension distal end member 314*b* on a side away from the fifth outer surface 355. The other end of the second insulating plate 382 on a side to the switch module 390 overlaps the first extension distal end member 314*b* in the z-direction.

Furthermore, as shown in FIG. 5, the other end of the second insulating plate 382 on a side of the switch module 390 extends more to a side of the negative terminal 370 than the first extension distal end member 314*b*. Accordingly, an insulation between the first conductive extension member 314 and the second conductive extension member 324 is easily maintained.

<Operations And Advantages>

As described above, the portion of the second conductive extension portion 324 between the connection portion with the second conductive base member 323 and the connection portion with the negative electrode distal end member 372 overlaps the first extension distal end member 314*b* in the z-direction.

Therefore, a magnetic field is easily canceled between the first extension distal end member 314*b* and the first extension distal end member 314*b* in the second conductive extension member 324. Therefore, an inductance of the first conductive extension member 314 and the second conductive extension member 324 is easily decreased.

Note that even if the positive terminal 360 has only the positive electrode base member 361 and the positive electrode base member 361 is connected to the first extension distal end member 314*b*, a part of the second conductive extension member 324 overlaps the first extension distal end member 314*b*. A magnetic field is easily canceled between the first extension distal end member 314*b* and the second conductive extension member 324.

As described above, the positive electrode distal end member 362 is connected to an end in the z-direction of an exposed portion of the positive electrode base member 361 from the fifth outer surface 355 and extends in the x-direction away from it. The first extension distal end member 314*b* of the first conductive extension member 314 is electrically and mechanically connected to a portion of the positive electrode distal end member 362 away from the fifth outer surface 355 by welding or the like.

According to this, it is possible to widen an overlapping area between a portion of the positive electrode distal end member 362 on a side away from the fifth outer surface 355 in the z-direction and the first extension distal end member 314*b*. Therefore, an electrical and mechanical connection reliability between a portion of the positive electrode distal end member 362 on a side away from the fifth outer surface 355 and the first extension distal end member 314*b* is easily improved.

As described above, the switch module 390 and the capacitor 330 are arranged in a spaced apart manner in the y-direction. As described above, a part of the positive terminal 360 is exposed from the fifth outer surface 355 on a side to the third outer surface 353. A part of the negative terminal 370 is exposed from the fifth outer surface 355 on a side to the first outer surface 351.

As described above, a part of the positive electrode base member 361 exposed from the fifth outer surface 355 and the positive electrode distal end member 362 are located closer to the capacitor 330 in the y-direction than a part of the negative electrode distal end member 372 exposed from the fifth outer surface 355 and the negative electrode distal end member 372. The capacitor 330 is located closer to a part of the positive electrode base member 361 exposed from the fifth outer surface 355 and the positive electrode distal end member 362 in the y-direction than a part of the negative electrode base member 371 exposed from the fifth outer surface 355 and the negative electrode distal end member 372.

Therefore, the structure of the second conductive extension member 324 is less complicated. A part of the second conductive extension member 324 tends to overlap the first extension distal end member 314*b* in the z-direction.

As described above, one end of the first conductive extension member 314 is electrically and mechanically connected to a portion of the first conductive base member 313 on a side to the switch module 390 and on a side to the capacitor upper surface 332 by welding or the like. The first extension distal end member 314*b* of the first conductive extension member 314 is electrically and mechanically connected to a portion of the positive electrode distal end member 362 away from the fifth outer surface 355 by welding or the like.

Similarly, one end of the second conductive extension member 324 is electrically and mechanically connected to a portion of the second conductive base member 323 on a side to the switch module 390 and on a side to the capacitor upper surface 332 by welding or the like. The second extension distal end member 324*b* of the second conductive extension member 324 is electrically and mechanically connected to a portion of the negative electrode distal end member 372 away from the fifth outer surface 355 by welding or the like.

According to this, a relative positional deviation between the first conductive base member 313 and the first conductive extension member 314 is easily reduced. A relative positional deviation between the first conductive extension member 314 and the positive electrode distal end member 362 is easily reduced. A poor connection between the first conductive extension member 314 and the positive electrode distal end member 362 is easily suppressed.

Similarly, a relative positional deviation between the second conductive base member 323 and the second conductive extension member 324 is easily reduced. A relative positional deviation between the second conductive extension member 324 and the negative electrode distal end member 372 is easily reduced. A poor connection between the second conductive extension member 324 and the negative electrode distal end member 372 is easily suppressed.

As described above, the first extension distal end portion 314*b* is connected to a portion of the positive electrode distal end member 362 on a side away from the fifth outer surface 355. Therefore, a distance in the z-direction between the first extension distal end member 314*b* and a portion of the second conductive extension member 324 overlapping the first extension distal end member 314*b* in the z-direction is reduced by a thickness of the positive electrode distal end member 362 in the z-direction. A magnetic field is easily canceled between the first extension distal end member 314*b* and a portion of the second conductive extension member 324 overlapping the first extension distal end member 314*b* in the z-direction.

First Modification

Figure 6:
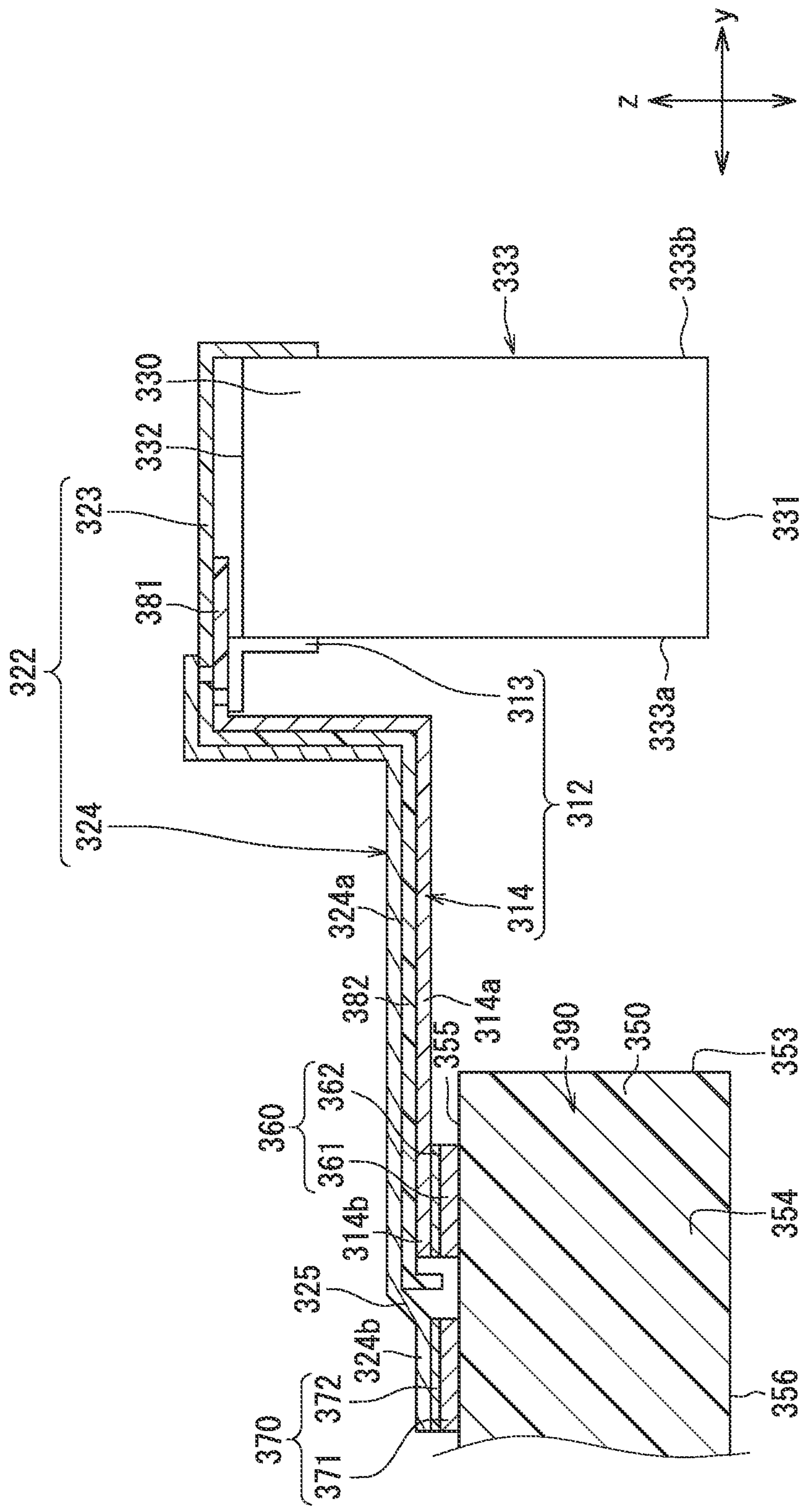
FIG. 6 is a perspective view explaining a modification of the electrical apparatus.

As shown in FIG. 6, portions of the first conductive member 312 and the second conductive member 322 between the connecting portions to the capacitor 330 and the connecting portions to the switch module 390 may be bent. Bending angles of the first conductive member 312 and the second conductive member 322 are not limited.

Also, one of the electrodes of the capacitor 330 may not be provided on the capacitor lower surface 331. The other electrode of the capacitor 330 does not have to be provided on the capacitor upper surface 332.

The capacitor connecting surface 333 has a first connecting surface and a third connecting surface arranged in a spaced apart manner in the x-direction, and a second connecting surface 333*a* and a fourth connecting surface 333*b* arranged in a spaced apart manner in the y-direction. The first connecting surface, the second connecting surface 333*a*, the third connecting surface, and the fourth connecting surface 333*b* are annularly connected in the circumferential direction around the z-direction. The second connecting surface 333*a* is located on a side to the switch module 390. The fourth connecting surface 333*b* is located away from the switch module 390 in the y-direction.

One electrode of the capacitor 330 may be provided on the second connecting surface 333*a*. One electrode of the capacitor 330 may be provided on the fourth connecting surface 333*b*.

Second Modification

Figure 7:
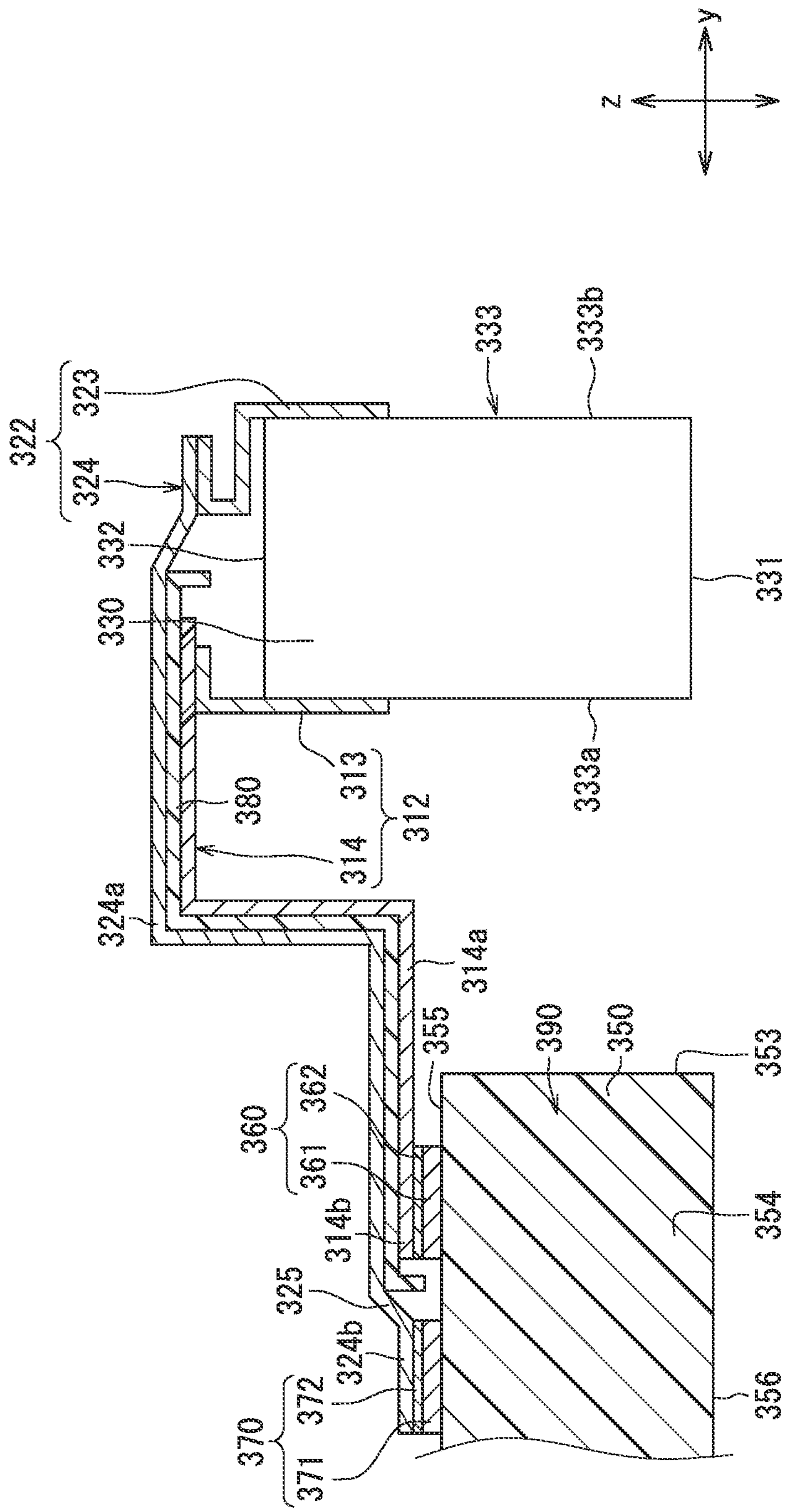
FIG. 7 is a perspective view explaining a modification of the electrical apparatus.

If one of the electrodes provided in the capacitor 330 is connected to the second connecting surface 333*a* as shown in FIG. 7, the first conductive base member 313 extending in the z-direction toward the capacitor upper surface 332 may be connected to the second connecting surface 333*a*.

Similarly, if the other electrode of the capacitor 330 is connected to the fourth connecting surface 333*b*, the second conductive base member 323 extending in the z-direction toward the capacitor upper surface 332 may be connected to the fourth connecting surface 333*b*.

In that case, the first conductive extension member 314 may be connected to an end of the first conductive base member 313 on a side to the capacitor upper surface 332. A portion of the first conductive extension member 314 between a portion connected to the first conductive base member 313 and a portion connected to the positive electrode distal end member 362 may be bent.

Similarly, the second conductive extension member 324 may be connected to an end of the second conductive base member 323 on a side to the capacitor upper surface 332. A portion of the second conductive extension member 324 between a portion connected to the second conductive base member 323 and a portion connected to the negative electrode distal end member 372 may be bent.

In this case, the first insulating plate 381 and the second insulating plate 382 are integrally connected. An insulating plate in which the first insulating plate 381 and the second insulating plate 382 are integrally connected is referred to as an insulating plate 380. The insulating plate 380 maintains an insulation between the first conductive member 312 and the second conductive member 322. Since the first insulating plate 381 and the second insulating plate 382 are integrally connected, a number of parts constituting the electrical apparatus 300 is reduced.

Third Modification

Figure 9:
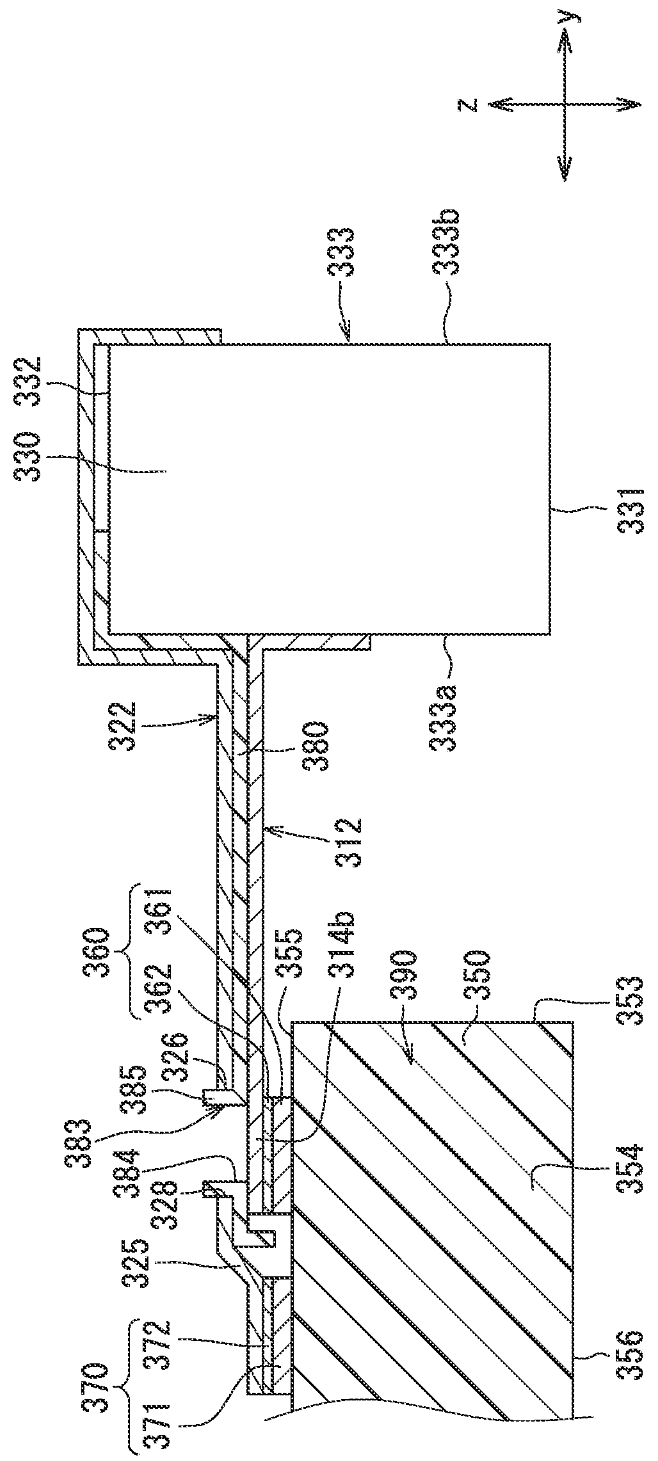
FIG. 9 is a cross-sectional view taken along a line IX-IX in FIG. 8.

As shown in FIG. 9, the first conductive base member 313 and the first conductive extension member 314 may be integrally connected. The second conductive base member 323 and the second conductive extension member 324 may be integrally connected. The first insulating plate 381 and the second insulating plate 382 may be integrally connected.

Therefore, in the following description, the relationship between the first conductive member 312, the second conductive member 322, and the insulating plate 380 is described in detail. In order to simplify the explanation, the portion of the first conductive extension member 314 connected to the positive electrode distal end member 362 is shown as the first extension distal end portion 314*b*.

The second conductive member 322 may be formed with a first through hole 326 at a part of a portion overlapping the first extension distal end portion 314*b* in the z-direction in a penetrating manner in the z-direction.

The insulating plate 380 may be formed with a second through hole 383 at a part of a portion overlapping the first extension distal end portion 314*b* in the z-direction in a penetrating manner in the z-direction.

Figure 8:
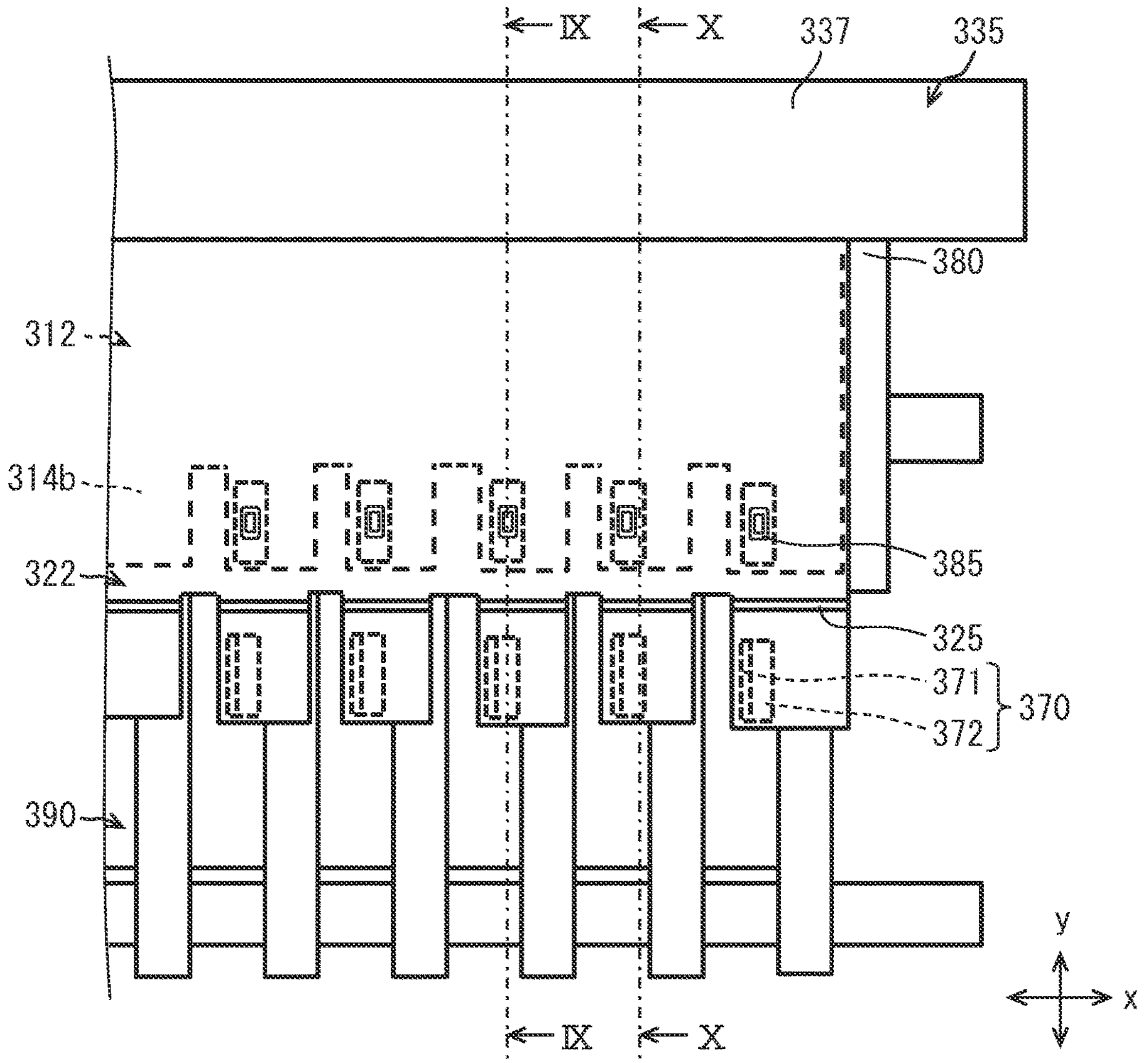
FIG. 8 is a top view explaining a modification of the electrical apparatus.

In addition, as shown in FIG. 8 and FIG. 9, the insulating plate 380 may be formed with a defining portion 385 which extends in the z-direction from the second defining wall 384 defining the second through hole 383 so as to pass through the first through hole 326.

The defining portion 385 opposes the first defining wall 328 defining the first through hole 326 in a direction perpendicular to the z-direction. The defining portion 385 has a tubular shape as shown in FIG. 8 and FIG. 9.

Accordingly, a relative positional deviation between the first conductive member 312 and the second conductive member 322 is easily suppressed.

An electrical and mechanical connection between the first extension distal end member 314*b* and the positive electrode distal end member 362 may be visually confirmed through the communicating hole which communicates the first through hole 326 and the second through hole 383.

Figure 10:
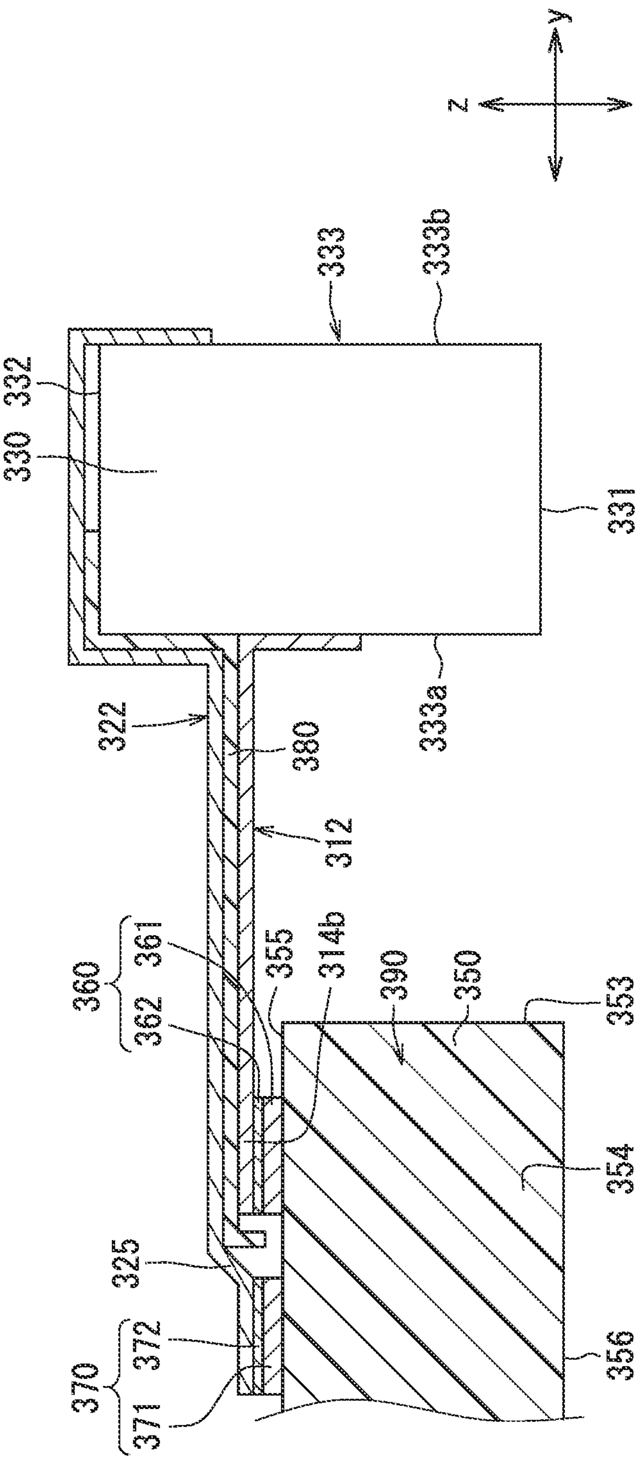
FIG. 10 is a cross-sectional view taken along a line X-X in FIG. 8.

Further, as shown in FIG. 10, a portion of the second conductive member 322 around the first through hole 326 overlaps the first extension distal end member 314*b* in the—direction.

As a result, a magnetic field is easily canceled between the first extension distal end member 314*b* and the portion around the first through hole 326 of the second conductive member 322.

Fourth Modification

Figure 11:
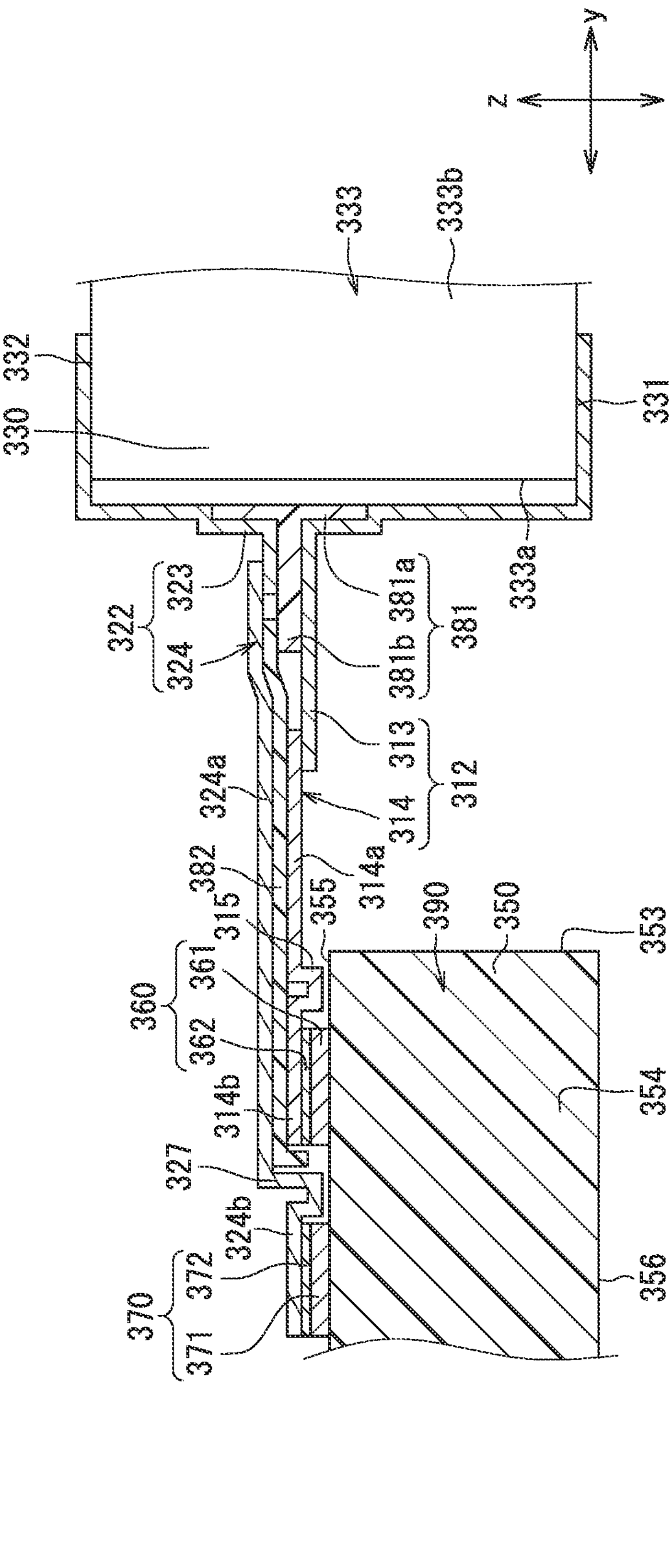
FIG. 11 is a perspective view explaining a modification of the electrical apparatus.

As shown in FIG. 11, the second conductive extension member 324 may be formed with the second curved portion 327 curved in a U shape at a portion between a portion connected to the negative electrode distal end member 372 and a portion overlapping the first extension distal end member 314*b* in the z-direction.

Note that the second curved portion 327 may not be provided on the second conductive extension member 324. The second curved portion 327 may be provided at a portion of the second conductive member 322 between a portion connected to the capacitor 330 and a portion connected to the negative terminal 370.

Similarly, the first conductive extension member 314 may be formed with a first curved portion 315 curved in a U shape at a portion between a portion connected to the positive electrode distal end member 362 and a portion connected to the first conductive base member 313.

Note that the first curved portion 315 may not be provided on the first conductive extension member 314. The first curved portion 315 may be provided at a portion of the first conductive member 312 between a portion connected to the capacitor 330 and a portion connected to the positive terminal 360.

According to this, the first extension distal end member 314*b* is easily bent in the z-direction with the first curved portion 315 as a starting point. Therefore, a relative positional deviation in the z-direction between the first extension distal end member 314*b* and the positive electrode distal end member 362 is easily suppressed.

Similarly, the second extension distal end member 324*b* is easily bent in the z-direction with the second curved portion 327 as a starting point. Therefore, a relative positional deviation in the z-direction between the second extension distal end member 324*b* and the negative electrode distal end member 372 is easily suppressed.

Note that the second curved portion 327 does not have to be U-shaped. The second curved portion 327 may have a spring-like shape. The first curved portion 315 does not have to be U-shaped. The first curved portion 315 may have a spring-like shape.

Fifth Modification

Figure 12:
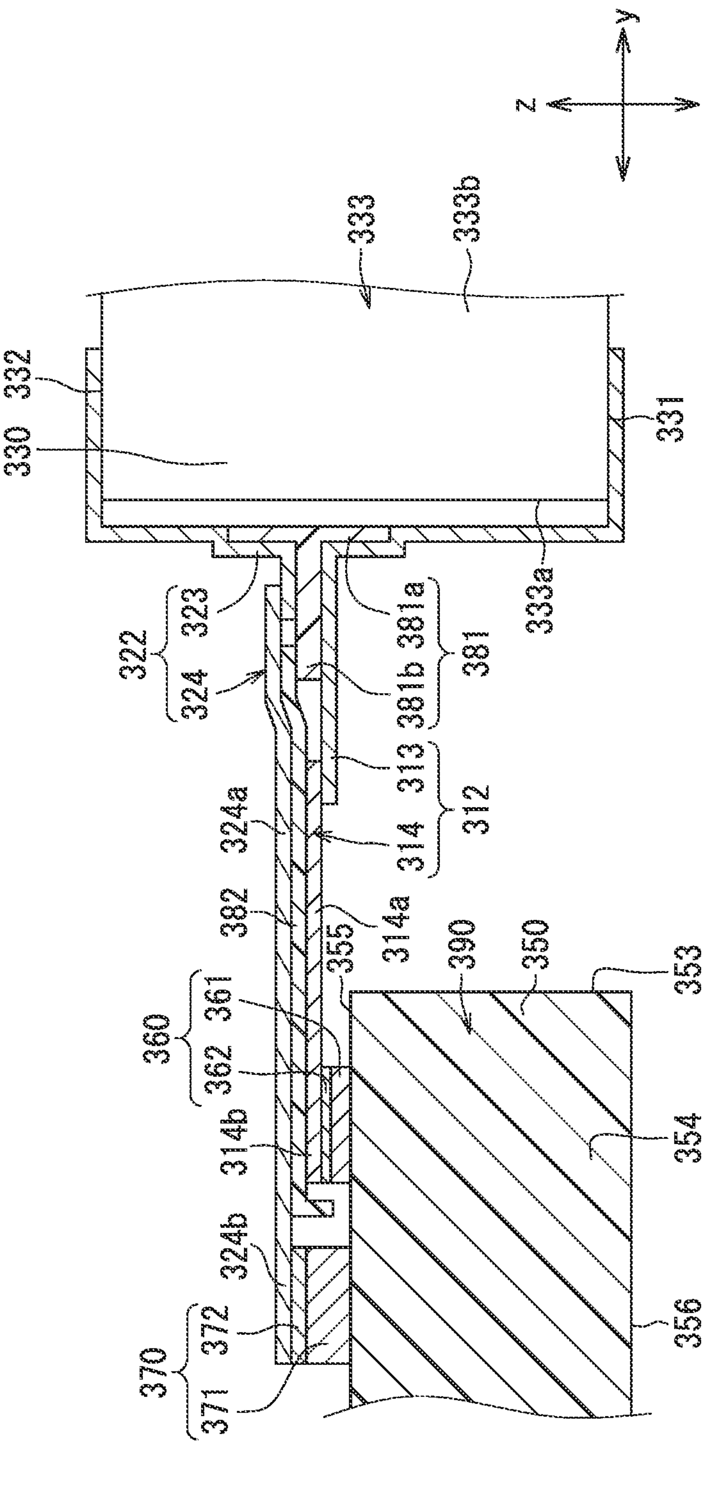
FIG. 12 is a perspective view explaining a modification of the electrical apparatus.

As shown in FIG. 12, a length of the negative electrode base member 371 in the z-direction exposed from the fifth outer surface 355 may be longer than a length of the positive electrode base member 361 in the z-direction exposed from the fifth outer surface 355. The second conductive extension member 324 may not be formed with a bent portion 325 which extends in each of the y-direction and the z-direction and is located between a connection portion to the negative electrode distal end member 372 and a portion overlapping the first extension distal end member 314*b* in the z-direction.

Sixth Modification

Figure 13:
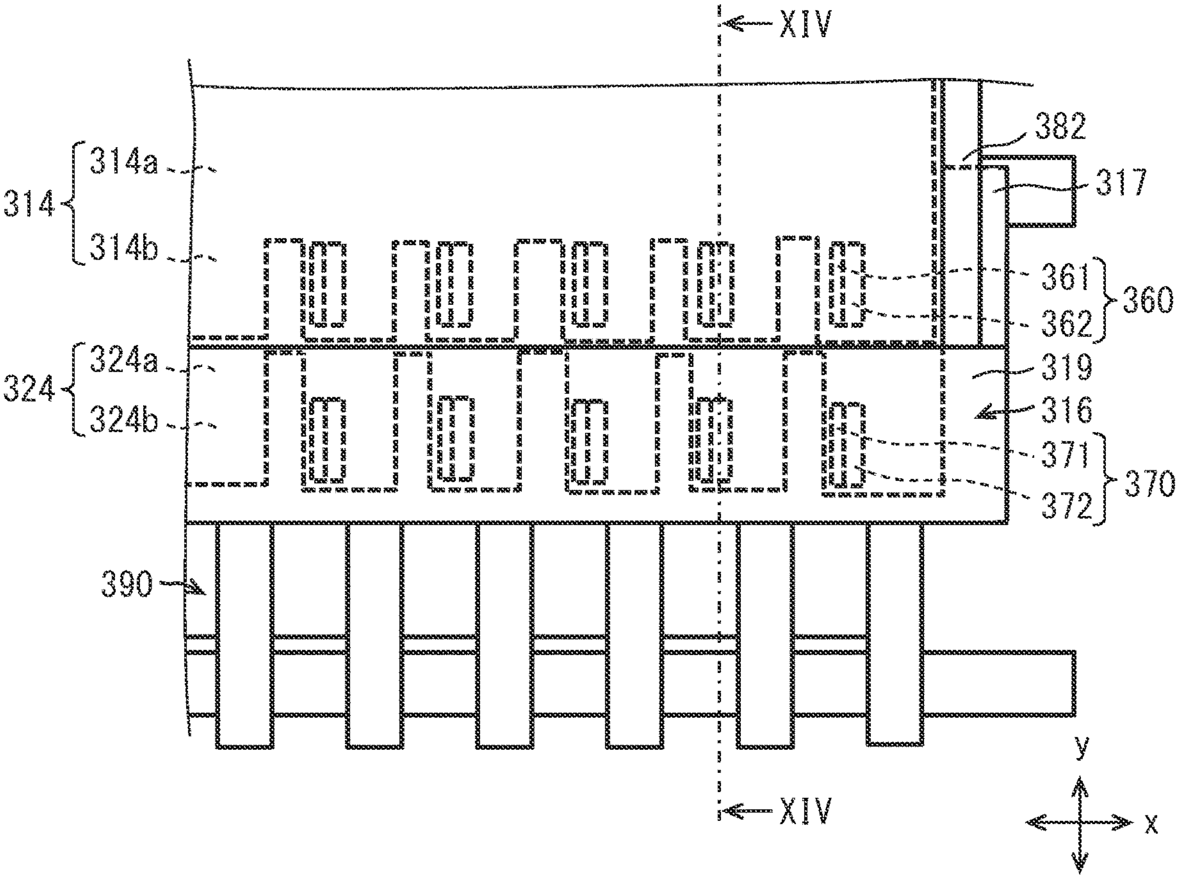
FIG. 13 is a top view explaining a modification of the electrical apparatus.

A third conductive member 316 may be connected to the first conductive extension member 314 as shown in FIG. 13. The third conductive member 316 includes two pieces of third conductive base members 317 connected to the first conductive extension member 314, a third conductive extension member 319 overlapping the second conductive extension member 324 in the z-direction, and a third conductive connecting member 318 connecting the third conductive base members 317 and the third conductive extension member 319. Note that the third conductive member 316 corresponds to a third power supply member.

Two pieces of the third conductive base members 317 are arranged in a spaced apart manner in the x-direction. Each of two pieces of the third conductive base members 317 is electrically and mechanically connected, such as by welding, to an end, in the x-direction, of the first conductive extension member 314.

The third conductive connecting member 318 is connected to an end, in the y-direction, of each of two pieces of the third conductive base members 317. The third conductive connecting member 318 extends in the z-direction toward a side of the second conductive extension member 324.

The third conductive extension member 319 has a flat shape with a thin thickness in the z-direction. The third conductive extension member 319 is connected to the end of the third conductive connection portion 318 on a side to the second conductive member 322 in the z-direction and extends in the y-direction in a manner that away from the capacitor 330.

The third conductive extension member 319 overlaps the positive terminal 360 and the negative terminal 370 respectively in the z-direction.

Figure 14:
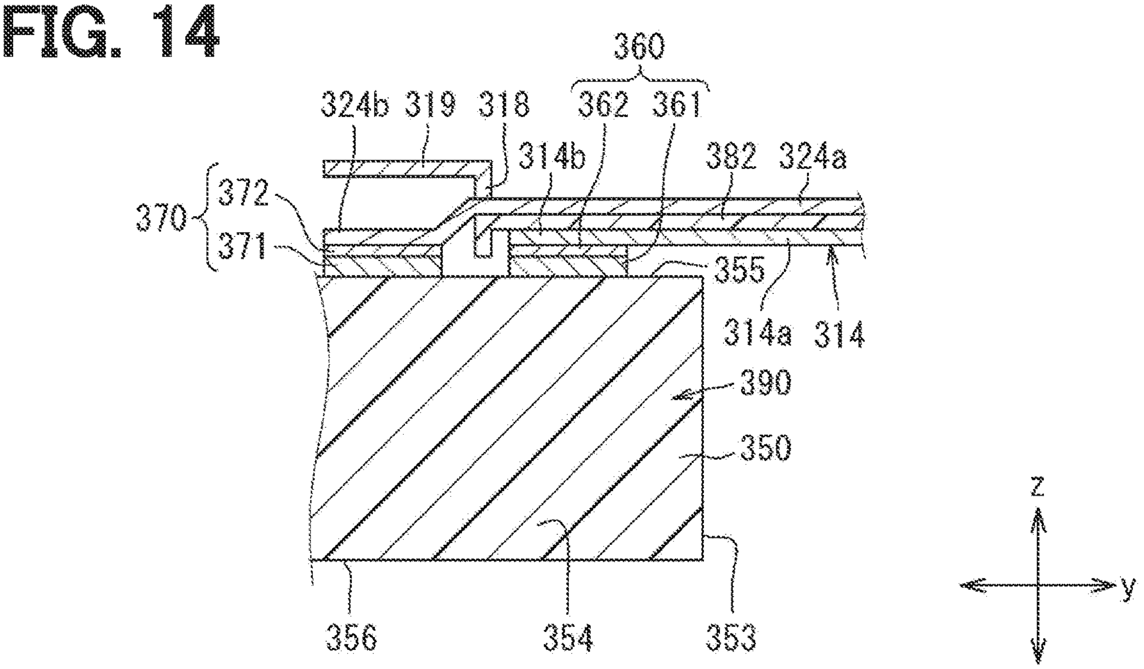
FIG. 14 is a cross-sectional view taken along a line XIV-XIV in FIG. 13.

As a result, as shown in FIG. 14, the portion of the second extension distal end member 324*b* connected to the negative electrode distal end member 372 overlaps with the third conductive extension member 319 in the z-direction.

Further, as shown in FIG. 14, the first extension distal end member 314*b* is located between the connection portion of the second conductive extension member 324 with the second conductive base member 323 and the connection portion of the second conductive extension member 324 to the negative electrode distal end member 372.

As a result, a magnetic field is easily canceled between the portion of the second extension distal end member 324*b* connected to the negative electrode distal end member 372 and the portion of the third conductive extension member 319 which overlaps the portion of the second extension distal end member 324*b* connected to the negative electrode distal end member 372 in the z-direction.

Similarly, a magnetic field is easily canceled between the first extension distal end member 314*b* and the portion of the second conductive extension member 324 overlapping the first extension distal end member 314*b* in the z-direction.

Although not shown, an insulating plate 380 may be provided between a portion of the third conductive extension member 319 where the negative electrode distal end member 372 of the second extension distal end member 324*b* is connected and a portion overlapping in the z-direction. In this case, in the z-direction, it becomes possible to reduce a distance between the portion of the third conductive extension portion 319 where the negative electrode distal end member 372 of the second extension distal end member 324*b* is connected and the portion overlapping in the z-direction. A magnetic field is easily canceled between the third conductive extension member 319 and the portion of the second extension distal end member 324*b* connected to the negative electrode distal end member 372.

Seventh Modification

Figure 15:
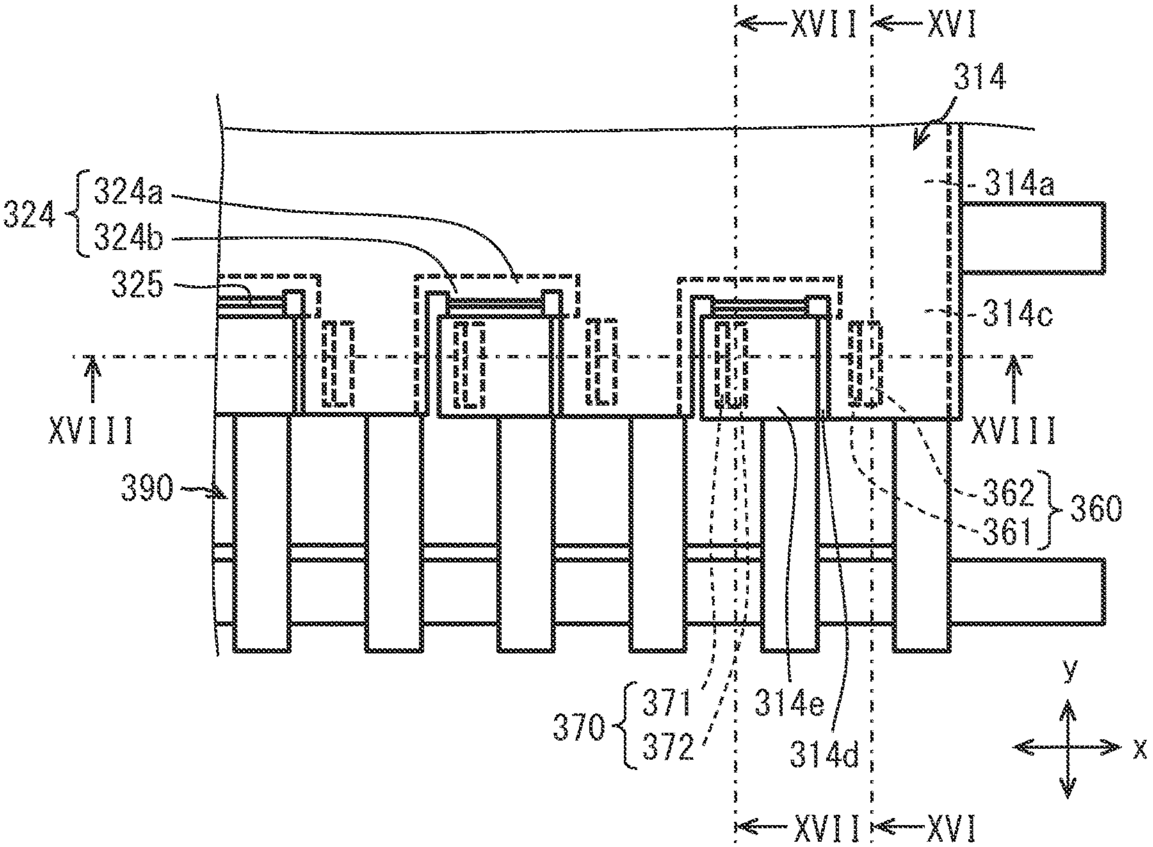
FIG. 15 is a top view explaining a modification of the electrical apparatus.

As shown in FIGS. 15-18, the electrical apparatus 300 may adopt a one-in-one package in which the switch module 390 encloses one switch, and either the positive terminal 360 or the negative terminal 370 is exposed from the fifth outer surface 355. The positive terminals 360 and the negative terminals 370 are alternately arranged in a spaced apart manner in the x-direction as shown in FIG. 15, for example.

Figure 18:
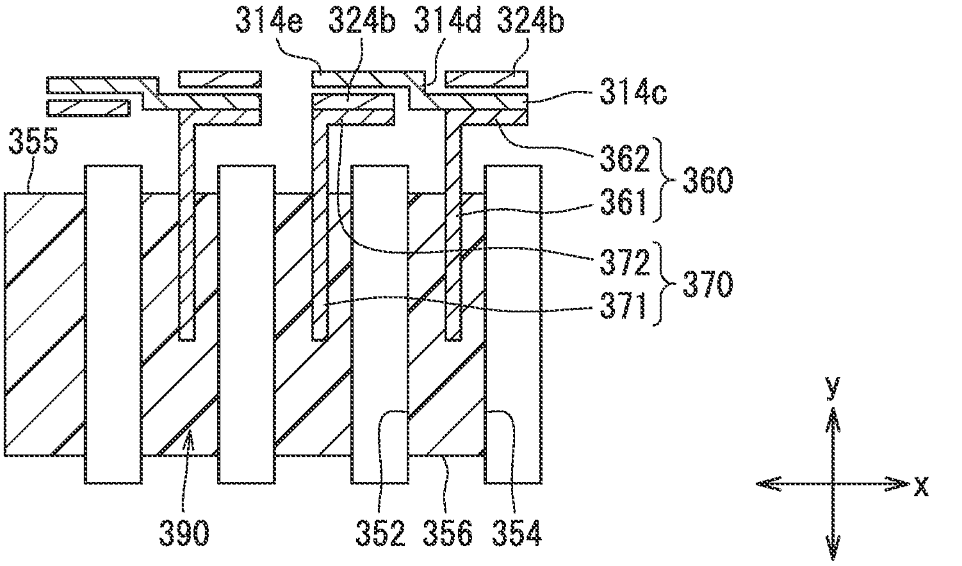
FIG. 18 is a cross-sectional view taken along a line XVIII-XVIII in FIG. 15.

In that case, as shown in FIG. 15 and FIG. 18, the first conductive extension member 314 includes a first extension base member 314*a*, a first extension structural portion 314*c*, a second extension structural portion 314*d*, and a third extension structural portion 314*e*.

The first extension structural portion 314*c* is integrally connected to an end of the first extension base member 314*a* on a side away from the capacitor 330 in the y-direction. The first extension structural portion 314*c* extends in the y-direction away from the first extension base member 314*a*.

The second extension structural portion 314*d* is integrally connected to an end of the first extension structural portion 314*c* in the x-direction. Then, the second extension structural portion 314*d* extends away in the z-direction.

The third extension structural portion 314*e* is integrally connected to an end of the second extension structural portion 314*d* in the z-direction. The third extension structural portion 314*e* extends away from the second extension structural portion 314*d* in the x-direction.

Next, the second conductive member 322 is described. As previously described, the second conductive extension member 324 has a second extension base member 324*a* and a plurality of second extension distal end members 324*b* connected to an end of the second extension base member 324*a* spaced apart from the capacitor 330 in the y-direction. The second extension distal end members 324*b* are arranged in a spaced apart manner in the x-direction by a predetermined distance.

Figure 17:
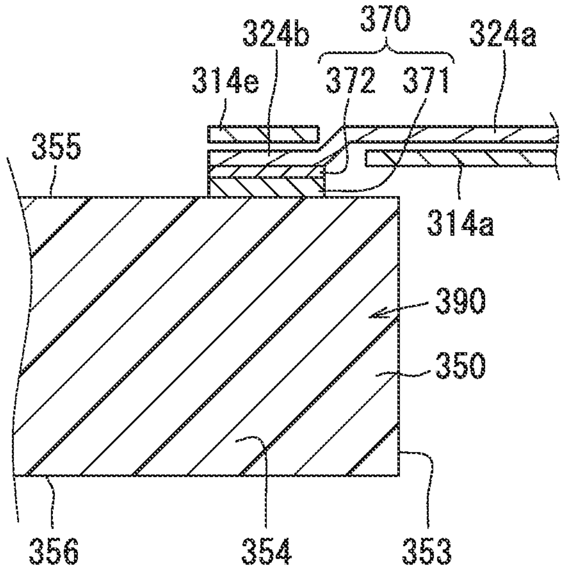
FIG. 17 is a cross-sectional view taken along a line XVII-XVII in FIG. 15.

The bent portion 325 is formed as shown in FIG. 15 and FIG. 17, at the second extension distal end member 324*b* extending toward the negative terminal 370 among the plurality of second extension distal end member 324*b*. The second extension distal end member 324*b* is provided closer to the negative terminal 370 by an amount of the bent portion 325.

Figure 16:
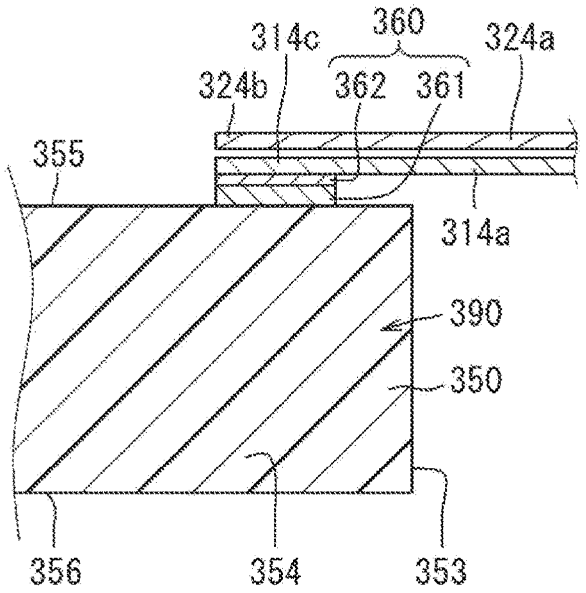
FIG. 16 is a cross-sectional view taken along a line XVI-XVI in FIG. 15.

Also, as shown in FIG. 16 and FIG. 18, the first extension structural portion 314*c* is connected to the positive electrode distal end member 362. The second extension distal end member 324*b* is provided on a side of the first extension structural portion 314*c* away from the positive electrode distal end member 362 in the z-direction.

As a result, a portion of the first extension structural portion 314*c* connected to the positive electrode distal end member 362 and the second extension distal end member 324*b* overlap in the z-direction. A magnetic field is easily canceled between the portion of the first extension structural member 314*c* connected to the positive electrode distal end member 362 and the second extension distal end member 324*b*.

Also, as described above, the plurality of second extension distal end members 324*b* are arranged in a form spaced apart in the x-direction. The second extension structural portion 314*d* is placed to pass through the gap between adjacent the second extension distal end members 324*b*.

As shown in FIG. 17 and FIG. 18, the second extension distal end member 324*b* is connected to the negative electrode distal end member 372. The third extension structural portion 314*e* is provided on a side of the second extension distal end member 324*b* spaced apart from the negative electrode terminal 370 in the z-direction.

As a result, a portion of the second extension distal end member 324*b* connected to the negative terminal 370 and the third extension structural portion 314*e* overlap in the z-direction. A magnetic field is easily canceled between the portion of the second extension distal end member 324*b* connected to the negative terminal 370 and the third extension structural portion 314*e*.

In FIGS. 6-18 for explaining the modified examples described so far, the configuration necessary for explaining the modified examples is extracted and illustrated. For this reason, illustrations of the capacitor case 335 and the like are omitted as appropriate in FIGS. 6-18.

Other Modifications

In this embodiment, an example in which the electrical apparatus 300 is included in the in-vehicle system 100 for an electric vehicle is shown. However, the application of the electrical apparatus 300 is not particularly limited to the above example. For example, a configuration in which the electrical apparatus 300 is included in a system of a hybrid vehicle having a motor 400 and an internal combustion engine may also be adopted.

In this embodiment, the positive terminal 360 is arranged on a side close to the capacitor 330, and the negative terminal 370 is arranged on a side away from the capacitor 330 in the y-direction. However, the negative terminal 370 may be arranged on a side close to the capacitor 330, and the positive terminal 360 may be arranged on a side away from the capacitor 330 in the y-direction. Accordingly, the arrangement of the first power supply busbar 310 and the second power supply busbar 320 may be changed as appropriate. In that case, a part of the first power supply busbar 310 may overlap with the second extension distal end member 324*b* in the z-direction.

What is claimed is:

1. An electrical apparatus, comprising:

a switch module including a switch, a first terminal and a second terminal connected to the switch, and a resin member covering the switch, the first terminal and the second terminal;

a first power supply member electrically connected to a portion of the first terminal exposed from the resin member and one of two electrodes of a power supply; and a second power supply member electrically connected to a portion of the second terminal exposed from the resin member and the other one of the two electrodes of the power supply, wherein a portion of the first power supply member connected to the first terminal and a part of the second power supply member overlap in a perpendicular direction perpendicular to an arrangement direction in which the first terminal and the second terminal are arranged, and wherein the first terminal includes:

a terminal base member which has a distal end exposed from the resin member, is connected to the switch, and extends in the perpendicular direction; and a terminal distal end member which is connected to the distal end of the terminal base member and extends in a direction perpendicular to the perpendicular direction, and wherein the first power supply member is connected to the terminal distal end member, and wherein a portion of the first power supply member connected to the terminal distal end member and a part of the second power supply member overlap in the perpendicular direction.

2. The electrical apparatus according to claim 1, further comprising:

a capacitor connected to each of the first power supply member and the second power supply member, wherein the capacitor is located closer to the first terminal than the second terminal in the arrangement direction.

3. The electrical apparatus according to claim 2, wherein the first power supply member includes:

a first power supply base member connected to the capacitor; and a first power supply distal end member joined to the first power supply base member and the first terminal, respectively, and wherein the second power supply member includes:

a second power supply base member connected to the capacitor; and a second power supply distal end member joined to the second power supply base member and the second terminal, respectively.

4. The electrical apparatus according to claim 2, further comprising:

an insulating plate provided between the first power supply member and the second power supply member, wherein the second power supply member is formed with a first through hole at a part of a portion overlapping the first power supply member in the perpendicular direction in a penetrating manner in the perpendicular direction, and wherein the insulating plate is formed with a second through hole at a part of a portion overlapping the first power supply member in the perpendicular direction in a penetrating manner in the perpendicular direction, and wherein the insulating plate is formed with a defining portion which defines locations of the first power supply member and the second power supply member by opposing a first defining wall defining the first through hole from a second defining wall defining the second through hole.

5. The electrical apparatus according to claim 3, wherein the first power supply member, at a portion between a connection portion to the capacitor and a connection portion to the first terminal, and the second power supply member, at a portion between a connection portion to the capacitor and a connection portion to the second terminal, are formed with curved portions.

6. The electrical apparatus according to claim 1, further comprising:

a third power supply member electrically connected to the first power supply member, wherein a part of the second power supply member connected to the second terminal and a part of the third power supply member overlap in the perpendicular direction.

7. An electrical apparatus, comprising:

a switch module including a switch, a first terminal and a second terminal connected to the switch, and a resin member covering the switch, the first terminal and the second terminal;

a first power supply member electrically connected to a portion of the first terminal exposed from the resin member and one of two electrodes of a power supply;

a second power supply member electrically connected to a portion of the second terminal exposed from the resin member and the other one of the two electrodes of the power supply;

a capacitor connected to each of the first power supply member and the second power supply member, the capacitor being located closer to the first terminal than the second terminal in an arrangement direction in which the first terminal and the second terminal are arranged; and an insulating plate provided between the first power supply member and the second power supply member, wherein a portion of the first power supply member connected to the first terminal and a part of the second power supply member overlap in a perpendicular direction perpendicular to the arrangement direction in which the first terminal and the second terminal are arranged, the second power supply member is formed with a first through hole at a part of a portion overlapping the first power supply member in the perpendicular direction in a penetrating manner in the perpendicular direction, the insulating plate is formed with a second through hole at a part of a portion overlapping the first power supply member in the perpendicular direction in a penetrating manner in the perpendicular direction, and the insulating plate is formed with a defining portion which defines locations of the first power supply member and the second power supply member by opposing a first defining wall defining the first through hole from a second defining wall defining the second through hole.

8. The electrical apparatus according to claim 7, wherein the first power supply member includes:

a first power supply base member connected to the capacitor; and a first power supply distal end member joined to the first power supply base member and the first terminal, respectively, and the second power supply member includes:

a second power supply base member connected to the capacitor; and a second power supply distal end member joined to the second power supply base member and the second terminal, respectively.

9. The electrical apparatus according to claim 7, wherein the first power supply member, at a portion between a connection portion to the capacitor and a connection portion to the first terminal, and the second power supply member, at a portion between a connection portion to the capacitor and a connection portion to the second terminal, are formed with curved portions.

10. The electrical apparatus according to claim 7, further comprising:

a third power supply member electrically connected to the first power supply member, wherein a part of the second power supply member connected to the second terminal and a part of the third power supply member overlap in the perpendicular direction.

11. An electrical apparatus, comprising:

a switch module including a switch, a first terminal and a second terminal connected to the switch, and a resin member covering the switch, the first terminal and the second terminal;

a first power supply member electrically connected to a portion of the first terminal exposed from the resin member and one of two electrodes of a power supply;

a second power supply member electrically connected to a portion of the second terminal exposed from the resin member and the other one of the two electrodes of the power supply; and a capacitor connected to each of the first power supply member and the second power supply member, the capacitor being located closer to the first terminal than the second terminal in an arrangement direction in which the first terminal and the second terminal are arranged, wherein a portion of the first power supply member connected to the first terminal and a part of the second power supply member overlap in a perpendicular direction perpendicular to the arrangement direction in which the first terminal and the second terminal are arranged, wherein the first power supply member includes:

a first power supply base member connected to the capacitor; and a first power supply distal end member joined to the first power supply base member and the first terminal, respectively, and wherein the second power supply member includes:

a second power supply base member connected to the capacitor; and a second power supply distal end member joined to the second power supply base member and the second terminal, respectively, wherein the first power supply member, at a portion between a connection portion to the capacitor and a connection portion to the first terminal, and the second power supply member, at a portion between a connection portion to the capacitor and a connection portion to the second terminal, are formed with curved portions.

12. The electrical apparatus according to claim 11, further comprising:

a third power supply member electrically connected to the first power supply member, wherein a part of the second power supply member connected to the second terminal and a part of the third power supply member overlap in the perpendicular direction.

* * * * *